United States Patent
Wang et al.

(10) Patent No.: US 12,520,583 B2
(45) Date of Patent: *Jan. 6, 2026

(54) STACKING NANOSHEET TRANSISTORS WITH AN INTERMEDIATE GATE STRUCTURE ABSENT

(71) Applicant: TAIWAN SEMICONDUCTOR MANUFACTURING COMPANY LTD., Hsinchu (TW)

(72) Inventors: Pochun Wang, Hsinchu (TW); Guo-Huei Wu, Tainan (TW); Hui-Zhong Zhuang, Kaohsiung (TW); Chih-Liang Chen, Hsinchu (TW); Li-Chun Tien, Tainan (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 78 days.

This patent is subject to a terminal disclaimer.

(21) Appl. No.: 18/404,815

(22) Filed: Jan. 4, 2024

(65) Prior Publication Data

US 2024/0145481 A1    May 2, 2024

Related U.S. Application Data

(60) Continuation of application No. 17/829,330, filed on May 31, 2022, now Pat. No. 11,894,383, which is a
(Continued)

(51) Int. Cl.
*H10D 86/00*    (2025.01)
*B82Y 10/00*    (2011.01)
(Continued)

(52) U.S. Cl.
CPC ....... *H10D 86/215* (2025.01); *H01L 23/5226* (2013.01); *H01L 23/528* (2013.01); *H10D 86/011* (2025.01)

(58) Field of Classification Search
CPC .. H10D 86/215; H10D 86/011; H10D 30/014; H10D 30/43; H10D 30/6735;
(Continued)

(56) References Cited

U.S. PATENT DOCUMENTS 11,362,110 B2 *    6/2022   Wang ................. H01L 23/5226
11,894,383 B2 *    2/2024   Wang ................ H01L 21/76895

* cited by examiner

*Primary Examiner* — Herve-Louis Y Assouman
(74) *Attorney, Agent, or Firm* — WPAT LAW; Anthony King

(57) ABSTRACT

A semiconductor structure includes a first transistor, a second transistor, a first dummy source/drain, a third transistor, a fourth transistor, and a second dummy source/drain. The first transistor and a second transistor adjacent to the first transistor are at a first elevation. The first dummy source/drain is disposed at the first elevation. The third transistor and a fourth transistor adjacent to the third transistor, are at a second elevation different from the first elevation. The second dummy source/drain is disposed at the second elevation. The second transistor is vertically aligned with the third transistor. The first dummy source/drain is vertically aligned with a source/drain of the fourth transistor. The second dummy source/drain is vertically aligned with a source/drain of the first transistor. The gate structure between the second dummy source/drain and a source/drain of the third transistor is absent. A method for manufacturing a semiconductor structure is also provided.

20 Claims, 17 Drawing Sheets

Related U.S. Application Data division of application No. 16/927,740, filed on Jul. 13, 2020, now Pat. No. 11,362,110.

(60) Provisional application No. 62/907,426, filed on Sep. 27, 2019.

(51) Int. Cl.

| | |
|---|---|
| *H01L 21/74* | (2006.01) |
| *H01L 21/768* | (2006.01) |
| *H01L 23/522* | (2006.01) |
| *H01L 23/528* | (2006.01) |
| *H10D 30/01* | (2025.01) |
| *H10D 30/43* | (2025.01) |
| *H10D 30/67* | (2025.01) |
| *H10D 62/10* | (2025.01) |
| *H10D 84/01* | (2025.01) |
| *H10D 84/03* | (2025.01) |
| *H10D 86/01* | (2025.01) |
| *H10D 88/00* | (2025.01) |
| *H10D 89/10* | (2025.01) |

(58) Field of Classification Search
CPC .. H10D 30/6757; H10D 62/121; H10D 84/85; H10D 88/00; H10D 89/10; H10D 84/0172; H10D 84/0186; H10D 84/038; H10D 88/01; H10D 84/013; H10D 84/0135; H10D 84/0149; H10D 84/0158; H10D 84/834; H01L 23/5226; H01L 23/528; H01L 21/76895; H01L 21/743; B82Y 10/00

See application file for complete search history.

STACKING NANOSHEET TRANSISTORS WITH AN INTERMEDIATE GATE STRUCTURE ABSENT

PRIORITY CLAIM AND CROSS-REFERENCE

This application is a continuation of U.S. patent application Ser. No. 17/829,330 filed on May 31, 2022, entitled of "STAKING NANOSHEET TRANSISTORS", which is a divisional of U.S. patent application Ser. No. 16/927,740 filed on Jul. 13, 2020, entitled of "SEMICONDUCTOR DEVICE AND METHOD FOR MANUFACTURING THE SAME", which claims the benefit of provisional application No. 62/907,426 filed on Sep. 27, 2019 entitled "Semiconductor Structure and Method for Forming The Same," the disclosure of which is hereby incorporated by reference in its entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling-down process generally provides benefits by increasing production efficiency and lowering associated costs while increasing the amount of functionality that can be provided in the reduced chip area. Such scaling down has increased complexities of processing and manufacturing ICs and also increased difficulties of layout design.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1:
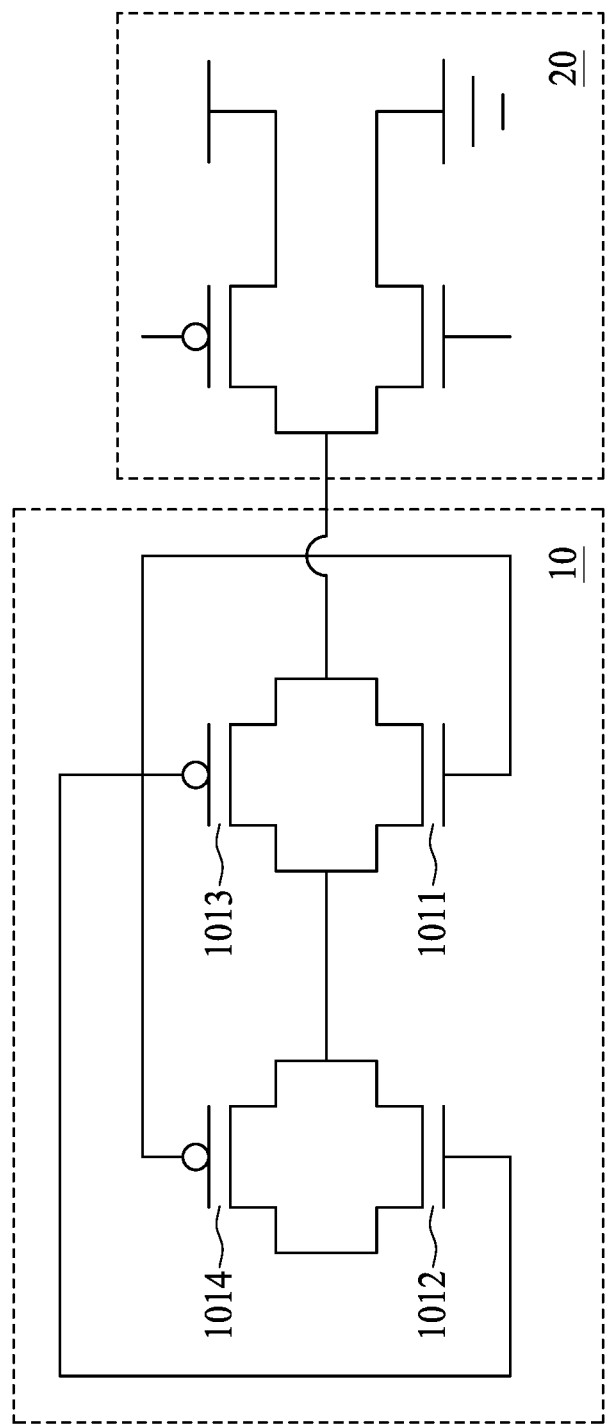
FIG. 1 is a circuit diagram of a transmission gate unit in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although the terms such as "first," "second" and "third" describe various elements, components, regions, layers and/or sections, these elements, components, regions, layers and/or sections should not be limited by these terms. These terms may be only used to distinguish one element, component, region, layer or section from another. The terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies.

Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Conventionally, transistors are laterally arranged on a silicon substrate; however, the lateral arrangement has limited a horizontal dimension of a chip. Moreover, in a conventional transmission gate unit, gate structures are disposed between every adjacent source/drain structures even some of the gate structures are dummy gate structures. The dummy gate structures not just increases a total power consumption of the transmission gate unit but also a dimension of a circuit layout due to the space for the dummy gate structure. The dummy gate structures may result in overall deduction of performance of the transmission gate unit.

The present disclosure provides a semiconductor structure without a dummy gate structure. In some embodiments, the semiconductor structure includes a source structure and a drain structure without a gate structure formed between the source structure and the drain structure. In some embodiments, two conductive plugs respectively to the source structure and the drain structure are not required to connect to a same metal line (to make the gate structure between the source structure and the drain structure dummy as in a conventional transmission gate unit), and thus, a design flexibility of connections to the source/drain structure are increased. In some embodiments, the semiconductor structure includes vertically stacked transistors having one or more gate structures disposed only in an upper transistor or only in a lower transistor. The transmission gate unit can be simplified by removing dummy gate structures and a dimension of the transmission gate unit can be reduced due to the presence of the conductive via. In some embodiments, the semiconductor structure has no dummy source/drain structures. Therefore, the transmission gate unit can be further simplified, the dimension of the transmission gate unit can be further reduced, and the power consumption of the transmission gate unit can be further reduced.

FIG. 1 is a circuit diagram of a transmission gate unit 10 of the present disclosure. The transmission gate unit 10 includes a first transistor 1011, a second transistor 1012, a third transistor 1013 and a fourth transistor 1014. The gate structure of the first transistor 1011 is electrically connected to the gate structure of the fourth transistor 1014, and the gate structure of the second transistor 1012 is electrically connected to the third transistor 1013 as shown in FIG. 1. The transmission gate unit 10 may connect to an electrical component. In some embodiments, the transmission gate unit 10 is electrically connected to an invertor unit 20 as shown in FIG. 1. However, it is for a purpose of illustration but not intended to limit the present disclosure. In other embodiments, the transmission gate unit 10 can connect to other types of electrical components.

Figure 2:
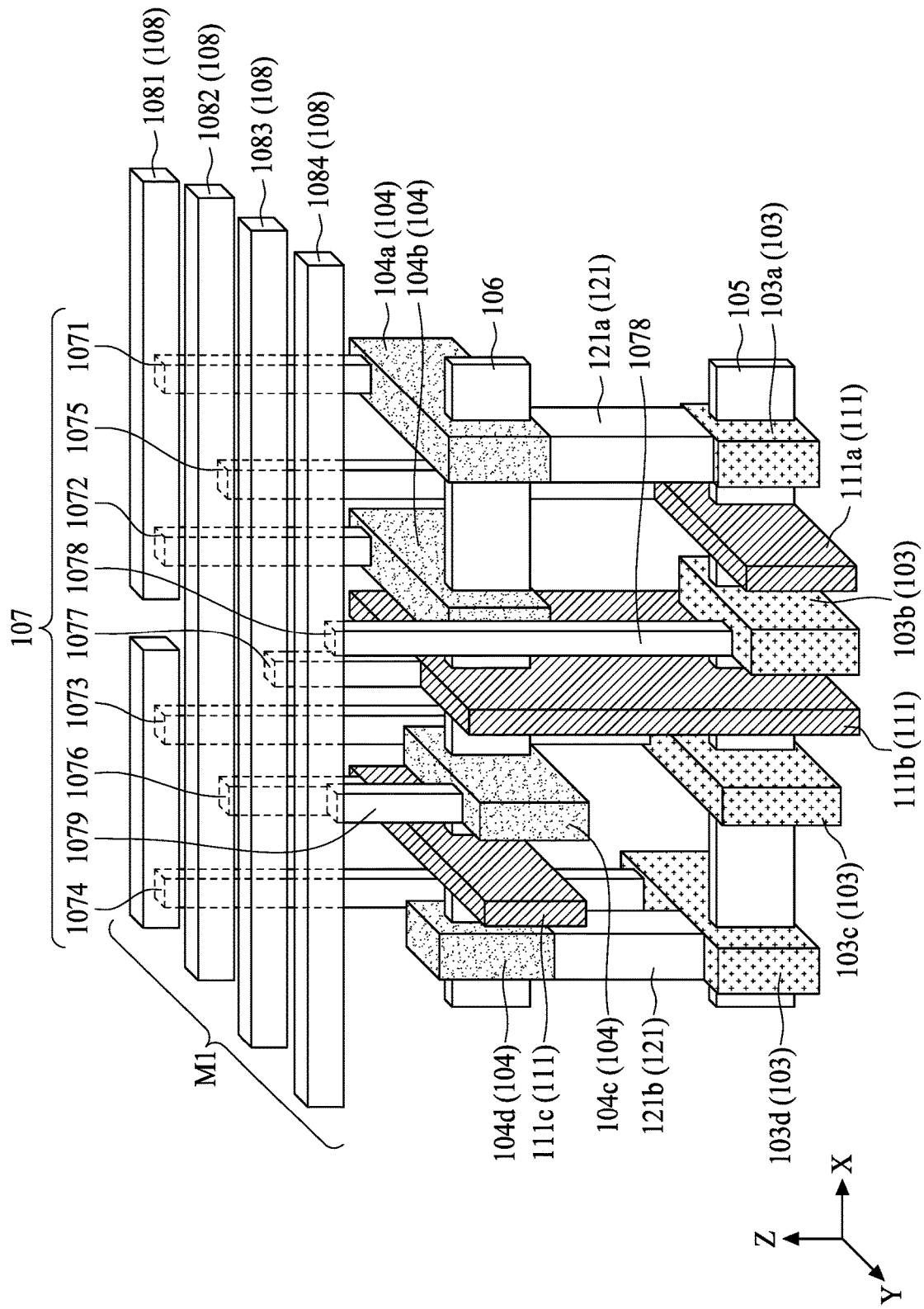
FIG. 2 is a schematic diagram of the semiconductor structure having a similar or same circuit diagram as shown in FIG. 1 according to some embodiments of the present disclosure.

FIG. 2 is a schematic diagram of a semiconductor structure 11 in accordance with some embodiments of the present disclosure. The semiconductor structure 11 defines the transmission gate unit 10 as depicted in FIG. 1. The semiconductor structure 11 includes vertically stacked transistors, at least one via sandwiched between two vertically adjacent source/drain structures, and no dummy gate structure. It should be noted that a dummy gate structure in the specification referred to as a gate structure has no actually function. A detailed structure and materials of the dummy gate structure can be similar or identical to a gate structure in the specification.

The semiconductor structure 11 includes a plurality of lower S/D structures 103 and a plurality of upper S/D structures 104 disposed over the plurality of lower S/D structures 103 respectively. The plurality of lower S/D structures 103 is disposed at a first elevation, and the plurality of upper S/D structures 104 is disposed at a second elevation different from the first elevation. As illustrated in FIG. 2, the second elevation is higher than the first elevation. It should be noted that, an ordinary skilled person in the art can understand the lower S/D structures 103 and the upper S/D structures 104 are formed on a semiconductive substrate, even the semiconductive substrate is not shown in FIG. 2. In some embodiments, the lower S/D structures 103 are formed adjacent to a lower portion 105 of a fin structure on a semiconductive substrate, and the upper S/D structures 104 are formed adjacent to an upper portion 106 of the fin structure on the semiconductive substrate. In addition, an individual source/drain structure of the plurality of lower S/D structures 103 and the plurality of upper S/D structures 104 can be a source or a drain depending on the function of the respective transistor and/or an electrical connection of the semiconductor structure 11.

The fin structure is doped with dopants, and a portion of the fin structure is disposed between source and drain structures of a transistor to function as a channel of the transistor. Therefore, in some embodiments, the lower portion 105 of the fin structure may be referred to as a first active layer 105. In some embodiments, the upper portion 106 of the fin structure may be referred to as a second active layer 106. The plurality of lower S/D structures 103 include first, second, third, and fourth lower S/D structures 103a, 103b, 103c and 103d. The plurality of upper S/D structures 104 includes first, second, third, and fourth upper S/D structures 104a, 104b, 104c, and 104d. In some embodiments, the upper S/D structures 104 are vertically aligned with the lower S/D structures 103 respectively.

The semiconductor structure 11 further includes a plurality of gate structures 111. Some of the gate structures are disposed around or over both the first active layer 105 and the second active layer 106 and extend from the first active layer 105 to the second active layer 106; some of the gate structures are disposed around or over only the first active layer 105 and be separated from the second active layer 106; and some of the gate structures are disposed around or over only the second active layer 106 and be separated from the first active layer 105. In some embodiments as illustrated in FIG. 2, the plurality of gate structures 111 includes a first gate structure 111a, a second gate structure 111b, and a third gate structure 111c serially arranged along a lateral direction (along an extending direction of the semiconductive substrate, e.g. the X direction). The first gate structure 111a and the third gate structure 111c are disposed at two opposite sides of the second gate structure 111b along the X direction but are at different elevations. However, the second gate structure 111b overlaps both the first gate structure 111a and the third gate structure 111c along the X direction. The first gate structure 111a is disposed between the lower S/D structures 103 in the first active layer 105 and is separated from the second active layer 106. In other words, the first gate structure 111a surrounds the first active layer 105 and is only at the first elevation. The second gate structure 111b extends from the first active layer 105 to the second active layer 106. The second gate structure 111b is disposed between the upper S/D structures 104 and also between the lower S/D structures 103. In other words, the second gate structure 111b surrounds the first active layer 105 and the second active layer 106 and is disposed at the first elevation and the second elevation. The third gate structure 111c is disposed between the upper S/D structures 104 in the first active layer 105 and separated from the first active layer 105. In other words, the third gate structure 111c surrounds the second active layer 106 and is only at the second elevation.

The first lower S/D structure 103a, the first gate structure 111a, and the second lower S/D structure 103b together define the first transistor 1011. The second lower S/D structure 103b, a lower portion of the second gate structure 111b surrounding the first active layer 105, and the third lower S/D structure 103c together define the second transistor 1012. The second upper S/D structure 104b, an upper portion of the second gate structure 111b surrounding the second active layer 106, and the third upper S/D structure 104c together define the third transistor 1013. The third upper S/D structure 104c, the third gate structure 111c, and the fourth upper S/D structure 104d together define the fourth transistor 1014. Therefore, in the embodiments shown in FIG. 2, the second lower S/D structure 103b is a shared S/D structure (or a common S/D structure) of the first transistor 1011 and the second transistor 1012; and the third upper S/D structure 104c is a shared S/D structure (or a common S/D structure) of the third transistor 1013 and the fourth transistor 1014. The first transistor 1011, the second transistor 1012, the third transistor 1013 and the fourth transistor 1013 together define the transmission gate unit 10. In some embodiments, the first transistor 1011, the second transistor 1012, the third transistor 1013 and the fourth transistor 1013 are fin field-effect transistors. In some embodiments, the first transistor 1011, the second transistor 1012, the third transistor 1013 and the fourth transistor 1013 are gate-all-around field-effect transistors.

In some embodiments, the second transistor 1012 is vertically aligned with the third transistor as shown in FIG. 2. The first transistor 1011 and the fourth transistor 1014 are disposed at two opposite sides of the second gate structure 111b. As illustrated in FIG. 2, a gate structure between the first upper S/D structure 104a and the second upper S/D structure 104b is absent. Similarly, a gate structure between the third lower S/D structure 103c and the fourth upper S/D structure 103d is absent. The first upper S/D structure 104a and the fourth upper S/D structure 103d are individually referred to as dummy S/D structures.

The semiconductor structure 11 further includes a plurality of vias 121, sandwiched between one or more of the lower S/D structures 103 and the corresponding upper S/D structures 104. In the embodiments shown in FIG. 2, a first via 121a of the plurality of vias 121 is disposed between the first lower S/D structure 103a and the corresponding first upper S/D structure 104a. A second via 121b of the plurality of vias 121 is disposed between the fourth lower S/D structure 103d and the corresponding fourth upper S/D structure 104d. The vias 121 can reduce complication of wire routing due to reduced quantity of contact plugs connecting the S/D structures 103 and 10 to an interconnect structure disposed over or under the transistors 1011, 1012, 1013 and 1014.

In some embodiments, the first transistor 1011 and the second transistor 1012 disposed at the first elevation have a same conductive types, and the third transistor 1013 and the fourth transistor 1014 disposed at the second elevation have a same conductive type different from that of the first transistor 1011 and the second transistor 1012. In some embodiments, the first transistor 1011 and the second transistor 1012 are NMOS, and the third transistor 1013 and the fourth transistor 1014 are PMOS.

The first transistor 1011 includes a first channel region in the first active layer 105 between the first lower S/D structure 103a and the second lower S/D structure 103b. Similarly, the second transistor 1012 includes a second channel region in the first active layer 105 between the second lower S/D structure 103b and the third lower S/D structure 103c; the third transistor 1013 includes a third channel region in the second active layer 106 between the second upper S/D structure 104b and the third upper S/D structure 104c; and the fourth transistor 1014 includes a fourth channel region in the second active layer 106 between the third upper S/D structure 104c and the fourth upper S/D structure 104d.

The semiconductor structure 11 may further include a first interconnect structure disposed over the third transistor 1013 and the fourth transistor 1014. The first interconnect structure is at a third elevation different from the first elevation and the second elevation. In some embodiments, the first interconnect structure is a front side interconnect structure (e.g. the interconnect structure formed over a front side of a wafer). However, the present application is note limited herein. In some embodiments of the present application, in order to further simplify the wire routing and reduce a dimension of the circuit layout, the semiconductor structure may further includes a second interconnect structure or a back side interconnect structure (e.g. an interconnect structure formed on a backside, opposite to the front side, of the wafer) (not shown in FIG. 2).

In some embodiment, the first interconnect structure includes a plurality of layers of conductive lines 108 surrounded by a plurality of intermetal dielectric layers (not shown). A material of the conductive lines 108 includes copper, tungsten, aluminum, nickel, other suitable materials, or a combination thereof. The conductive lines 108 in some embodiments are referred as metal lines 108. As shown in FIG. 2, only a portion of conductive lines 108 in a first layer M1 of the plurality of layers of the first interconnect structure is presented.

The semiconductor structure 11 further includes a plurality of contact plugs 107 to electrically connect the S/D structures 103 and 104 and the gate structures 111 to corresponding conductive lines 108. In some embodiments, the first layer M1 is the layer of the first interconnect structure closest to the transistors 1011, 1012, 1013 and 1014, but the present disclosure is not limited herein. The first lower S/D structure 103*a* and the first upper S/D structure 104*a* are electrically connected through the via 121*a*, and thus only one contact plug 1071 is required to electrically connect the first lower S/D structure 103*a* and the first upper S/D structure 104*a* to a conductive line 1081 of the conductive lines 108 in the first layer M1. As shown in FIG. 2, the first lower S/D structure 103*a* is electrically connected to the conductive line 1081 through the via 121*a*. Similarly, the fourth upper S/D structure 104*d* is electrically connected to a conductive line 1085 of the conductive lines 108 through the via 121*b*. Therefore, a number of contact plugs 107 for electrical connection to the first interconnect structure can be reduced, and complication of wire routing can be simplified.

In some embodiments in order to form a transmission gate unit using the structure as shown in FIG. 2, the first upper S/D structure 104*a* and the second upper S/D structure 104*b* are connected to the same conductive line 1081 of the conductive lines 108 through respective contact plugs 1071 and 1072, and the third lower S/D structure 103*c* and the fourth lower S/D structure 103*d* are connected to a same conductive line 1085 of the conductive lines 108 through respective contact plugs 1073 and 1074. The first gate structure 111*a* and the third gate structure 111*c* are connected to a same conductive line 1082 of the conductive lines 108 through respective contact plugs 1075 and 1076. The second gate structure 111*b* is connected to a conductive line 1083 of the conductive lines 108 through a contact plug 1077. The second lower S/D structure 103*b* and the third upper S/D structure 104*c* are connected to a same conductive line 1084 of the conductive lines 108 through respective contact plugs 1078 and 1079. The fourth upper S/D structure 104*d* is electrically connected to the conductive line 1085 through the second via 121*b*, the fourth lower S/D structure 103*d* and the contact plug 1074. The first lower S/D structure 103*a* is electrically connected to the conductive line 1081 through the first via 121*a*, the first upper S/D structure 104*a*, and the contact plug 1071.

Figure 3:
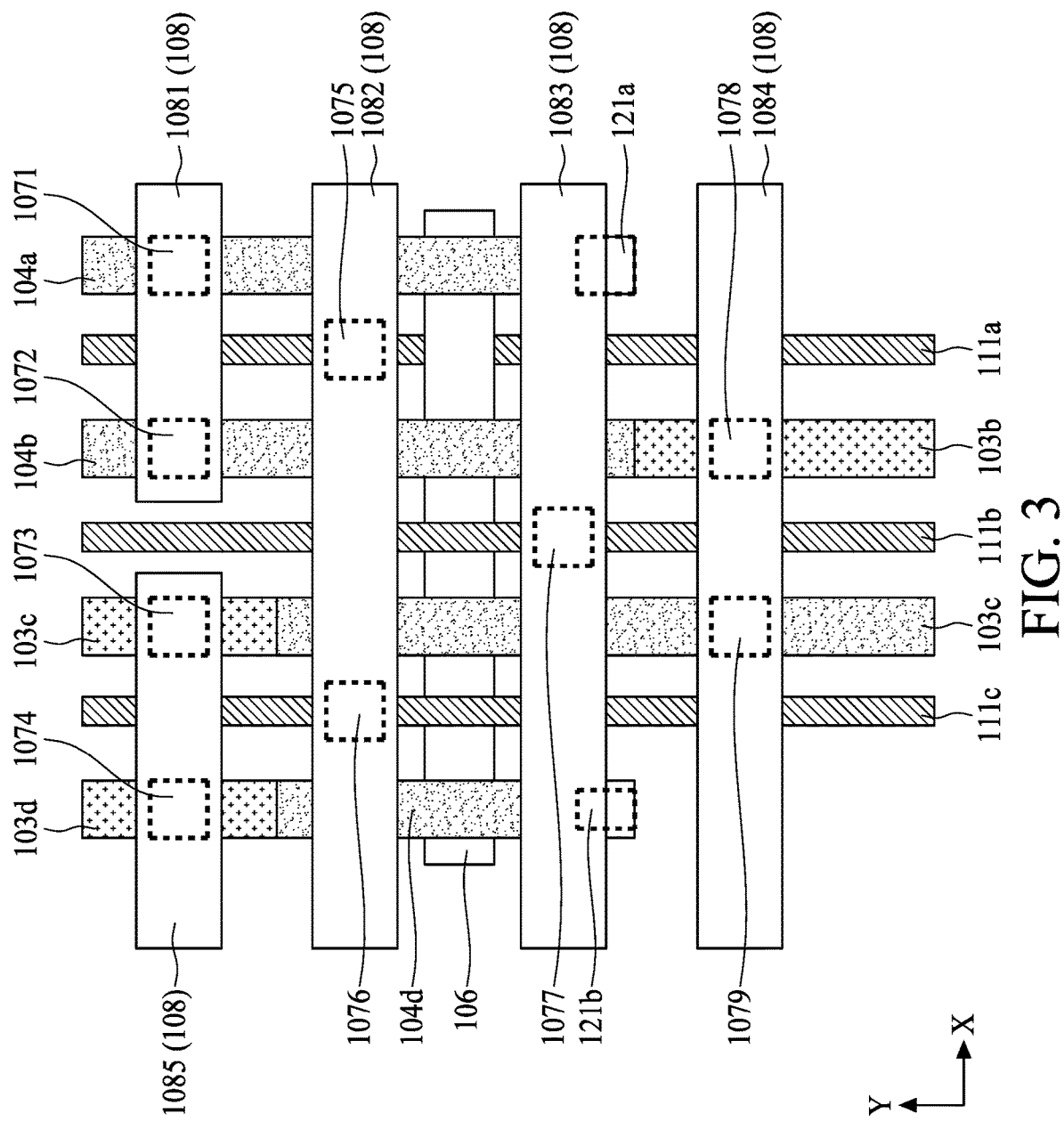
FIG. 3 is a top view of the semiconductor structure as shown in FIG. 2 in accordance with some embodiments of the present disclosure.

FIG. 3 is a top view of the semiconductor structure 11 as shown in FIG. 2. Each of the gate structures 111 extends along the Y direction and is substantially perpendicular to the fin structure (i.e. the upper portion 106 and the lower portion 105) extending along the X direction from the top view. In some embodiments, the gate structure 111 is a monolithic structure.

In some embodiments, the fourth upper S/D structure 104*d* may entirely overlap the fourth lower S/D structure 103*d*. However, it is not limited thereto as long as there is an overlapping area between the fourth upper S/D structure 104*d* and the fourth lower S/D structure 103*d* from the top view for the via 121*b* to connect thereinbetween. In other embodiments, the fourth upper S/D structure 104*d* partially overlaps the fourth lower S/D structure 103*d*. Similarly, the first lower S/D structure 103*a* can partially or entirely overlap the first upper S/D structure 104*a* (not show).

In order to connect the contact plug 1074 to the fourth lower S/D structure 103*d*, at least a portion of the fourth lower S/D structure 103*d* is exposed from the fourth upper S/D structure 104*d*. In some embodiments, a length of the fourth upper S/D structure 104*d* along the Y direction (along an extending direction of the gate structures 111) is substantially less than a length of the fourth lower S/D structure 103*d* along the Y direction from the top view. In some embodiments, the via 121*b* is entirely covered by the fourth upper S/D structure 104*d* and entirely overlaps the fourth lower S/D structure 103*d*. The disclosure is not limited herein as long as the via 121*b* is sandwiched between and electrically connects the fourth upper S/D structure 104*d* and the fourth lower S/D structure 103*d*.

In some embodiments, the first lower S/D structure 103*a* and the first upper S/D structure 104*a* are overlapped from the top view perspective. In the embodiments as shown in FIGS. 2-3, a length of the first upper S/D structure 104*a* along the Y direction (along an extending direction of the gate structure) is substantially greater than a length of the first lower S/D structure 103*a* along the Y direction. But the disclosure is not limited herein. Since the contact plug 1071 is connected to the first upper S/D structure 104*a* from the top (the front side of the wafer), the length of the first lower S/D structure 103*a* is not required to be less than the length of the first upper S/D structure 104*a*. In some embodiments, the length of the first upper S/D structure 104*a* is substantially less than or equal to the length of the first lower S/D structure 103*a*. In some embodiments, the via 121*a* is entirely covered by the first upper S/D structure 104*a* and entirely overlaps the first lower S/D structure 103*a*. In addition, a width of the vias 121 along the X direction (along an extending direction of the fin structure) is not limited herein. In some embodiments, the width of the via 121 is less than a width of the upper S/D structure 104 and/or a width of the lower S/D structure 103 along the X direction (e.g. the via 121*b* has a width along the X direction less than a width of the fourth upper S/D structure 104*d* and the fourth lower S/D structure 103*d*). In some embodiments, the width of the via 121 is equal to or greater than the width of the upper S/D structure 104 and/or the width of the lower S/D structure 103 (e.g. the via 121*a* has a width along the X direction substantially equal to a width of the fourth upper S/D structure 104*d* and the fourth lower S/D structure 103*d*).

In the embodiments as illustrated in the semiconductor structure 11, the second active layer 106 covers the first gate structure 111*a* from the top view perspective as shown in FIG. 3. In addition, in order to electrical connect the conductive line 1082 to the first gate structure 111*a* through the contact plug 1075, the second active layer 106 is separated from the conductive line 1082 from the top view perspective.

Figure 4:
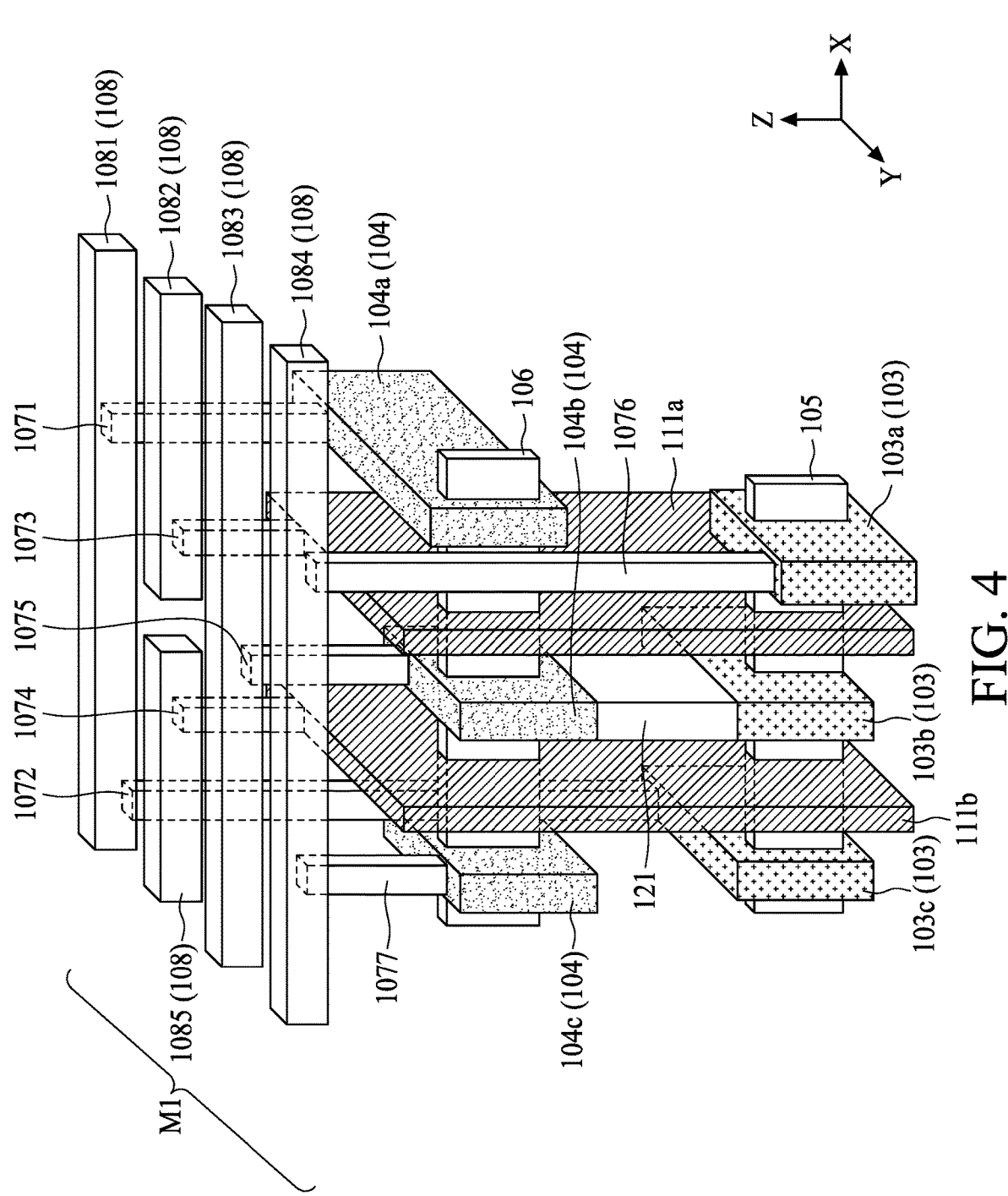
FIG. 4 is a schematic diagram of a semiconductor structure having a similar or same circuit diagram as shown in FIG. 1 according to some embodiments of the present disclosure.

FIG. 4 is a diagram of a semiconductor structure 12 in accordance with some embodiments of the present disclosure. In some embodiments, the semiconductor structure 12 is a transmission gate unit and has same functions and similar electrical connections as illustrated in FIG. 1. The semiconductor structure 12 has similar function and electrical connections as the semiconductor structure 11 but without the dummy S/D structures. In the embodiments of FIG. 4, the semiconductor structure 12 includes one via 121 and two gate structures 111*a* and 111*b*. The via 121 is sandwiched between the second upper S/D structure 104*b* and the second lower S/D structure 103*b* along the Z direction, and between the first gate structure 111*a* and the second gate structure 111*b* along the X direction. The first lower S/D structure 103*a*, the second lower S/D structure 103*b* and the lower portion of the first gate structure 111*a* together define the first transistor 1011. The first upper S/D structure 104*a*, the second upper S/D structure 104*b* and the upper portion of the first gate structure 111*a* together define the third transistor 1013. The second lower S/D structure 103*b*, the third lower S/D structure 103*c* and the lower portion of the second gate structure 111*b* together define the second transistor 1012. The second upper S/D structure 104*b*, the third upper S/D structure 104c and the upper portion of the second gate structure 111b together define the fourth transistor 1014.

In the embodiments, the via 121 is in contact with the second upper S/D structure 104b of the third transistor 1013 and the fourth transistor 1014, and also in contact with the second lower S/D structure 103b of the first transistor 1011 and the second transistor 1012. Therefore, the first transistor 1011 and the second transistor 1012 have a shared S/D structure 103b (or a common S/D structure 103b) and are electrically connected in series, and the third transistor 1013 and the fourth transistor 1014 have a shared S/D structure 104b (or a common S/D structure 104b) and are electrically connected in series. In the embodiments, the first transistor 1011 is vertically aligned with the third transistor 1013, and the second transistor 1012 is vertically aligned with the fourth transistor 1014. The first lower S/D structure 103a of the first transistor 1011 is electrically connected to the third upper S/D structure 104c of the fourth transistor 1014 through the conductive line 1084. The first upper S/D structure 104a of the third transistor 1013 is electrically connected to the third lower S/D structure 103c of the fourth transistor 1014 through the conductive line 1081. The semiconductor structure 12 of FIG. 4 has no dummy structures, and thus, less contact plugs and less vias 121 are included in the semiconductor structure 12 than the semiconductor structure 11. Therefore, power consumption and circuit layout of the semiconductor structure 12 can be further reduced.

Figure 5:
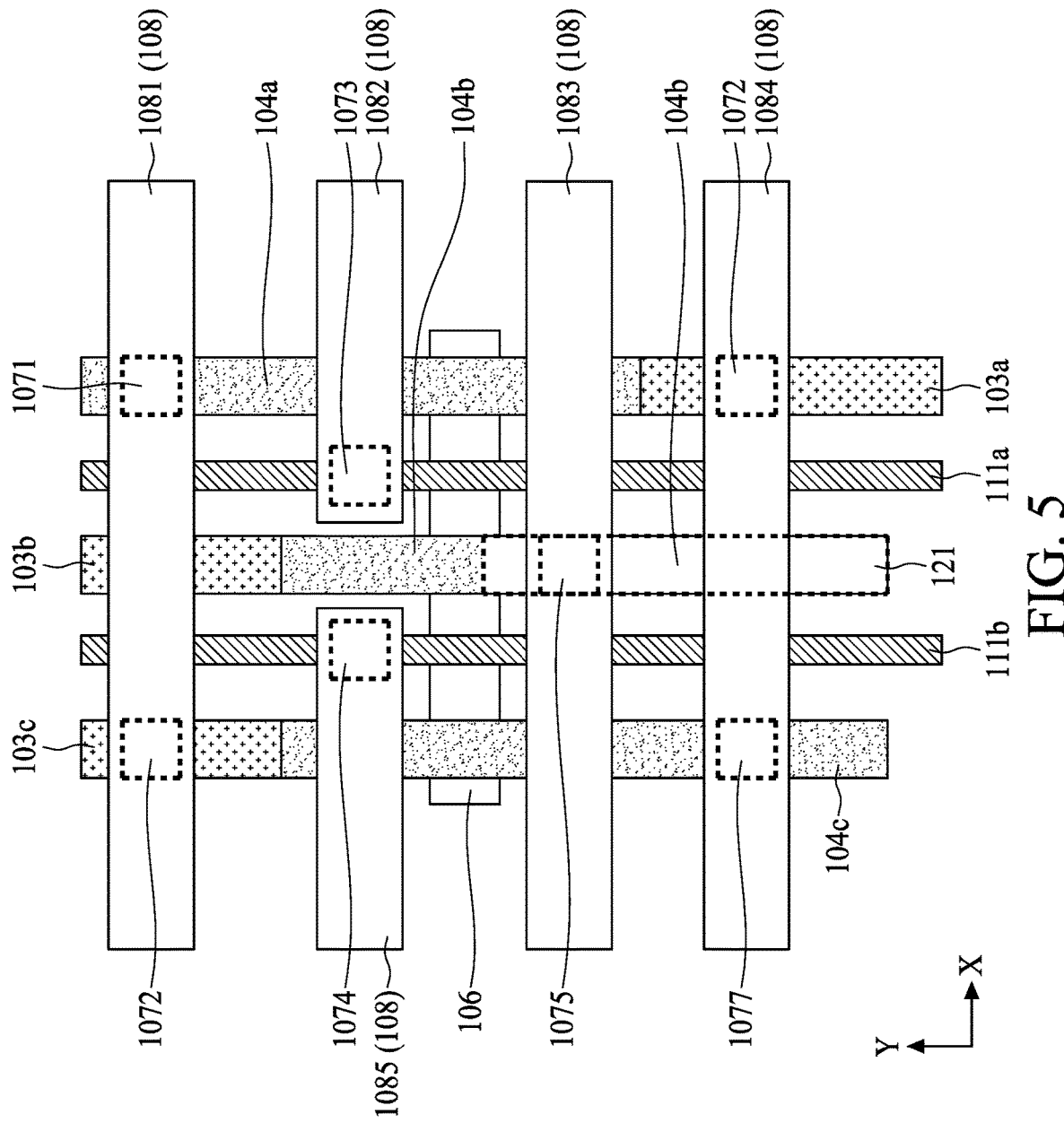
FIG. 5 is a top view of the semiconductor structure as shown in FIG. 4 in accordance with some embodiments of the present disclosure.

FIG. 5 is a top view of the semiconductor structure 12 as shown in FIG. 4. The top view of the semiconductor structure 12 as shown in FIG. 5 is a simplified version of the top views of the semiconductor structure 11 shown in FIG. 3. In some embodiments, the via 121 overlaps the second lower S/D structure 103b and the second lower S/D structure 104b from the top view perspective. In some embodiments, the via 121 is elongated along the Y direction or a longitudinal direction of the second lower S/D structure 103b and the second lower S/D structure 104 from the top view perspective. However, the present disclosure is not limited herein, as long as the via 121 is disposed between and electrically connects the second lower S/D structure 103b and the second lower S/D structure 104b.

Figure 6:
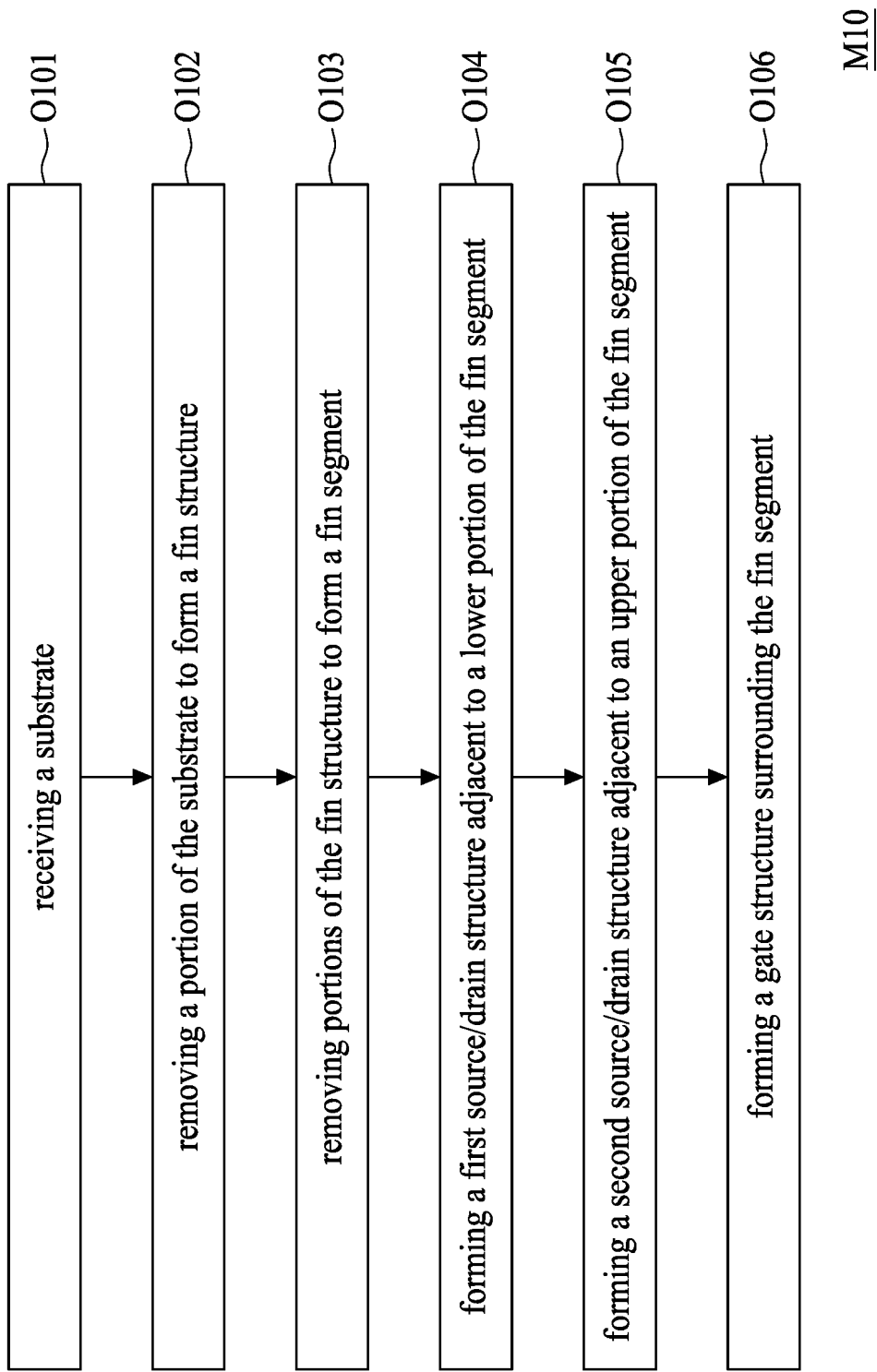
FIG. 6 is a flow chart of a method for forming a semiconductor structure in accordance with some embodiments of the present disclosure.

FIG. 6 is a flow chart illustrating a method M10 for manufacturing a semiconductor structure having a via disposed between vertically stacked S/D structures in accordance with some embodiments of the present disclosure. The method M10 includes several operations: (O101) receiving a substrate; (O102) removing a portion of the substrate to form a fin structure; (O103) removing portions of the fin structure to form a fin segment; (O104) forming a first S/D structure adjacent to a lower portion of the fin segment; (O105) forming a second S/D structure adjacent to an upper portion of the fin segment; and (O106) forming a gate structure surrounding the fin segment.

Figure 7:
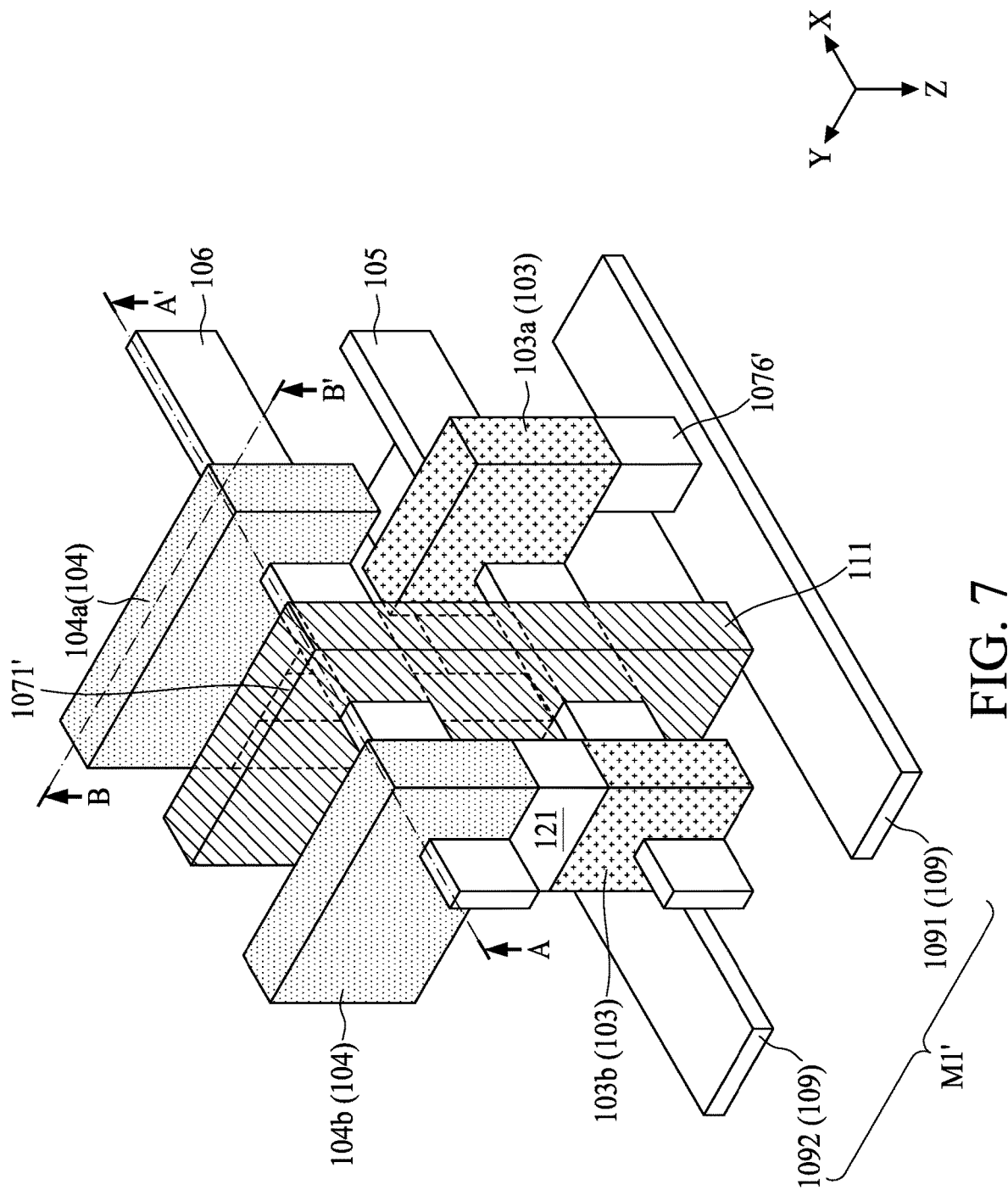
FIG. 7 is a schematic diagram of a semiconductor structure according to some embodiments of the present disclosure.

For ease of illustration, cross sections at different stages of the method M10 to form a semiconductor structure 13 as shown in FIG. 7 are provided. The semiconductor structure 13 is a 3D diagram showing a portion of the transmission gate unit similar to a portion of the semiconductor structure 12 as shown in FIG. 4 but having a second interconnect structure (or back side interconnect structure) in addition to the first interconnect structure. The second interconnect structure is disposed under the first transistor 101, and opposite to the first interconnect structure for electrical connections to the transmission gate unit. In some embodiment, the second interconnect structure is similar to the first interconnect structure, and includes a plurality of layers of conductive lines 109 surrounded by a plurality of intermetal dielectric layers (not shown). Materials of the conductive lines 109 can be same as or different from the conductive lines 108. The conductive lines 109 in some embodiments are referred as metal lines 109.

As shown in FIG. 7, only a portion of conductive lines 109 in a second layer M1' of the plurality of layers of the second interconnect structure is presented. In some embodiments, the second layer M1' is the layer of the second interconnect structure closest to the first transistor 101 and the second transistor 102, but the present disclosure is not limited herein. The second interconnect structure can reduce a number of contact plugs 107 connecting the first interconnect structure and the transmission gate unit, and a layout size can be further reduced.

Figure 8:
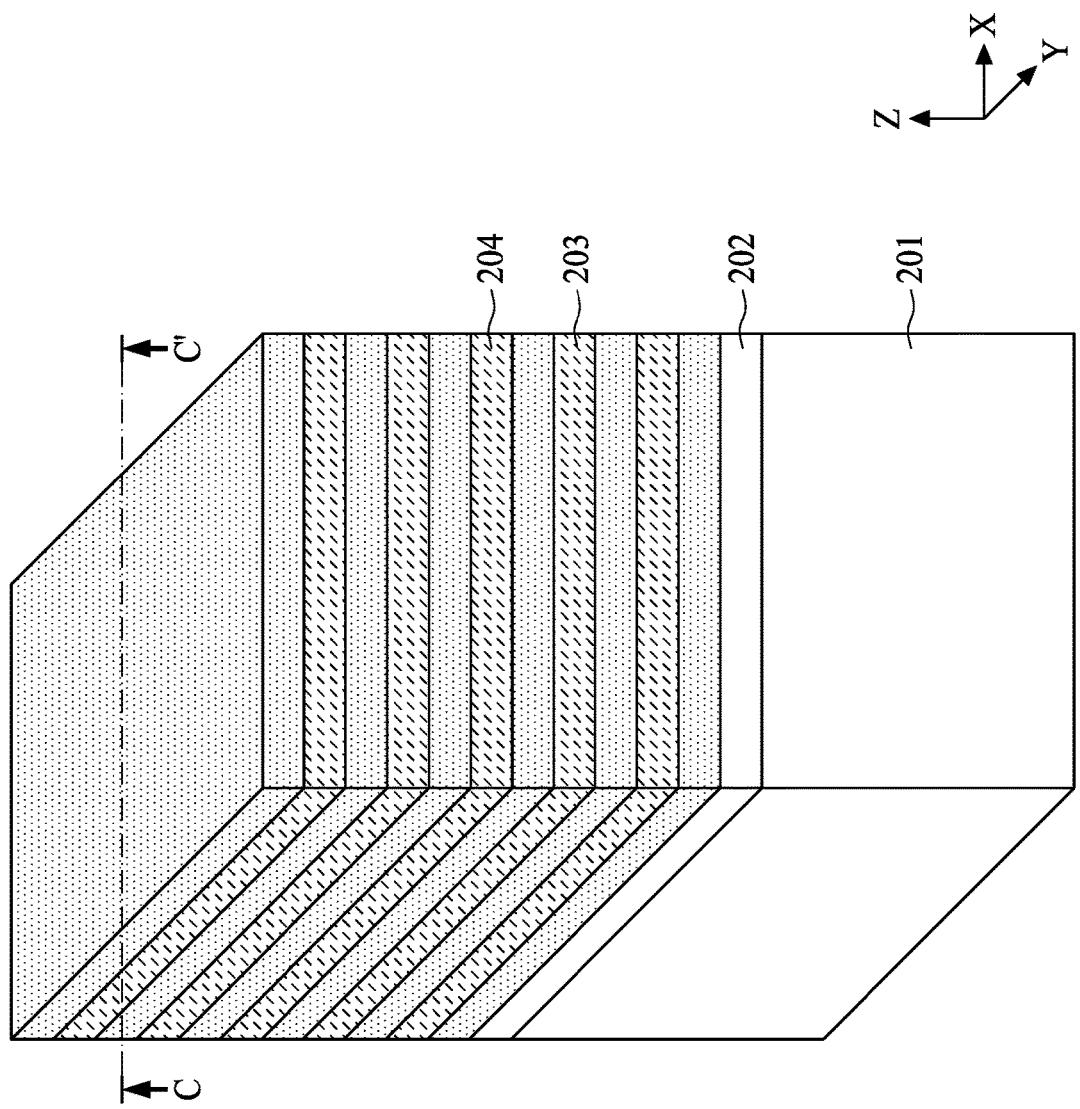
FIGS. 8-9 are schematic diagrams at beginning stages of a method for forming a semiconductor structure according to some embodiments of the present disclosure.
Figure 9:
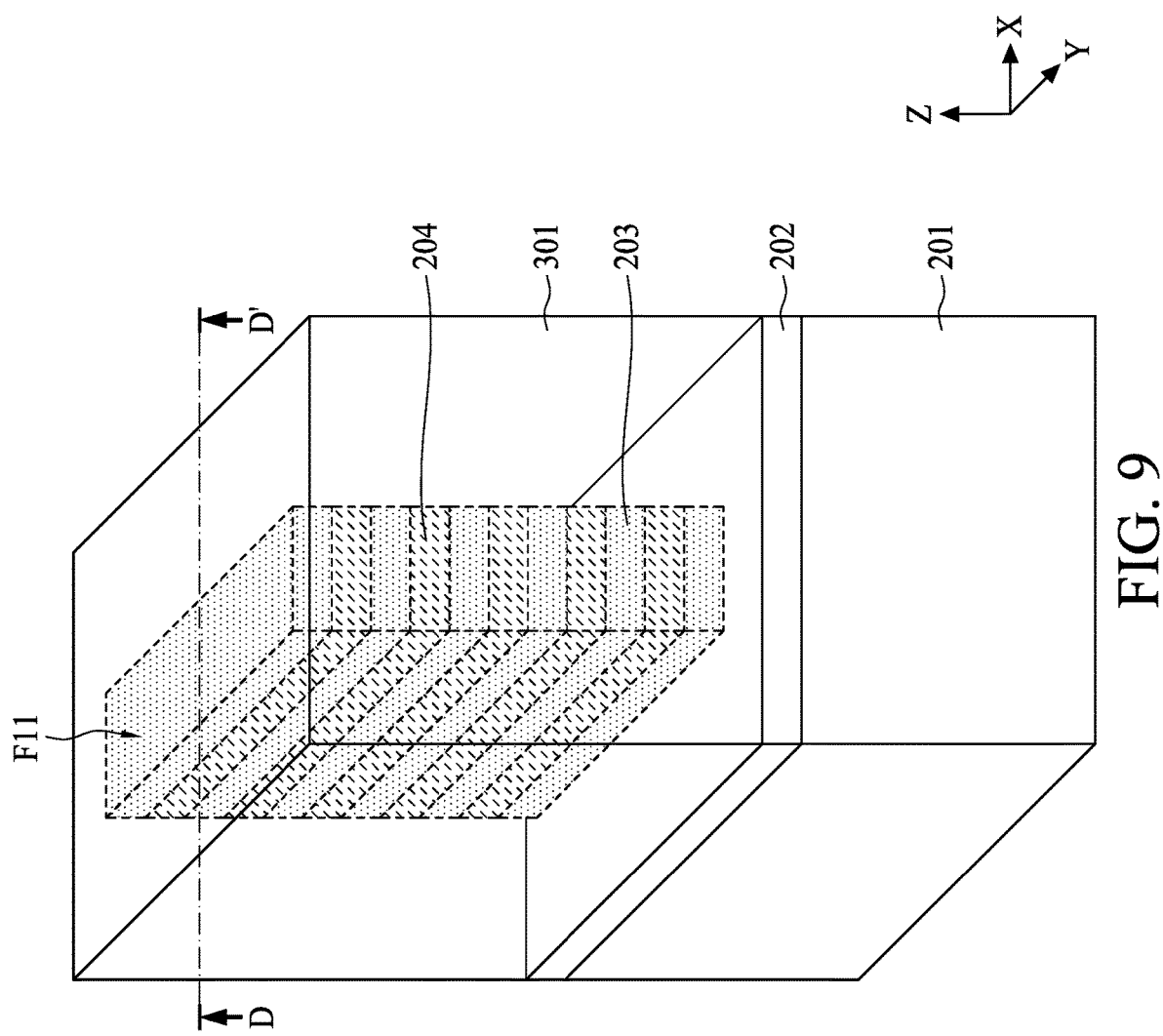

FIGS. 8 to 9 are diagrams in 3D views at beginning stages of the method M10, and FIGS. 10 to 29 are cross sections along a line A-A' of the semiconductor structure 13 shown in FIG. 7 at different stages of the method M10.

Referring to FIG. 8, in accordance with the operation O101, a substrate S1 is received. In some embodiments, the substrate S1 includes a dielectric layer 202 disposed on a semiconductive layer 201, and two different semiconductive layers 203 and 204 (a first semiconductive layer 203 and a second semiconductive layer 204) alternatively disposed on the dielectric layer 202. In some embodiments, the dielectric layer 202 includes silicon nitride, and the semiconductive layer 201 includes silicon. In some embodiments, the first semiconductive layer 203 and the second semiconductive layer 204 include silicon and silicon germanium respectively. In some embodiments, one or more hard layers (not shown) are disposed over the two different semiconductive layers 203 and 204 for protection of the underlying semiconductive layers 203 and 204 during the following process.

Referring to FIG. 9, in accordance with the operation O102, portions of the substrate S1 are removed to form one or more fin structures F11 (only one fin structure F11 is shown in FIG. 9 for illustration). In some embodiments, only portions of the alternatively stacked semiconductive layers 203 and 204 are removed to from the fin structure F11 (only portions of the substrate S1 above the dielectric layer 202 are removed). The fin structure F11 includes the alternatively stacked semiconductive layers 203 and 204. The first active layer 105 and the second active layer 106 are formed from different portions of the fin structure F11, detailed formation will be illustrated in the following description. After formation of the fin structure F11, an isolation 301 is formed surrounding the fin structure F11. In some embodiments, portions of alternatively stacked semiconductive layers 203 and 204 are patterned and removed, and dielectric material fills the space of the removed portions of the alternatively stacked semiconductive layers 203 and 204 to form the isolation 301 as shown in FIG. 9. The patterning of the semiconductive layers 203 and 204 and formation of the fin structure F11 are to define an active region of the semiconductor structure 12. In some embodiments, formation of the isolation 301 is to strain the fin structure F11. In some embodiments, the isolation 301 is formed to define the S/D structures 103 and 104 subsequently formed.

Figure 11:
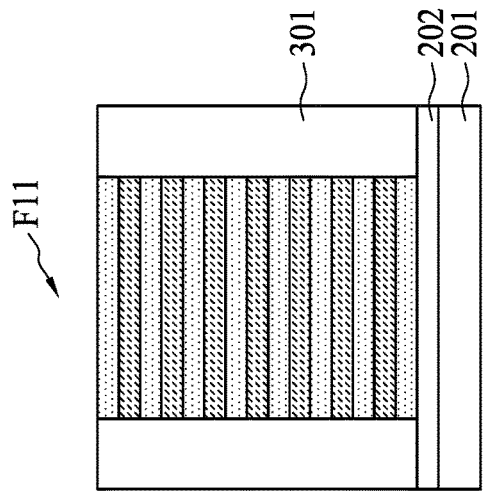
FIGS. 10-29 are cross sections at different stages of a method for forming a semiconductor structure according to some embodiments of the present disclosure.
Figure 10:
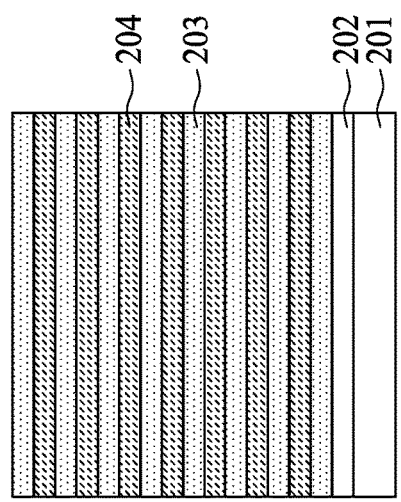

FIG. 10 is a cross section along a line C-C' in FIG. 8 of the substrate S1, which is also a cross section along the line A-A' in FIG. 7 at one of beginning stages of the method M10 for forming the semiconductor structure 13. FIG. 11 is a cross section along a line D-D' in FIG. 9 of the substrate S1, which is also a cross section along the line A-A' in FIG. 7 at one of beginning stages of the method M10 for forming the semiconductor structure 13. The isolation 301 from the cross section as shown in FIG. 11 is adjacent to two lateral sides of the fin structure F11.

Figure 13:
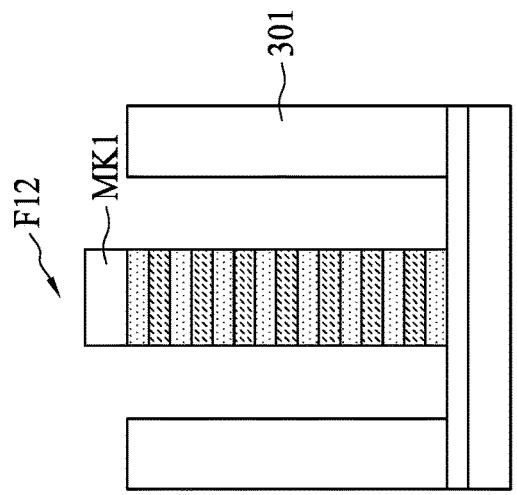
Figure 12:
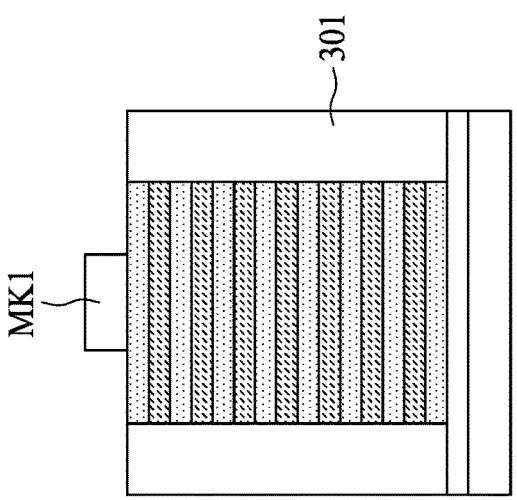

Referring to FIG. 12, a patterned mask layer MK1 is formed on the remaining fin structure F1t between the isolation 301. In some embodiments, the patterned mask layer MK1 includes nitride or other suitable material having etching selectivity to the two semiconductive layers 203 and 204, the dielectric layer 201 and the isolation 301. Portions of the fin structures F11 exposed from the patterned mask layer MK1 is removed, and thus, a fin segment F12 is formed covered by the patterned mask layer MK1 as shown in FIG. 13. The fin segment F12 is separated from the isolation 301. The fin segment F12 is where the gate structure 111 and the first and second channel regions are subsequently formed.

Figure 14:
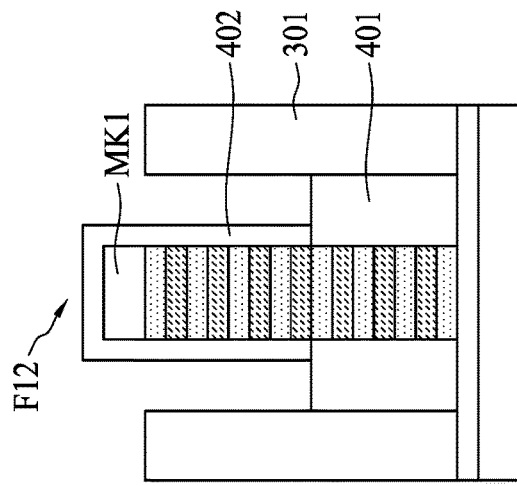

Formation of the lower S/D structures 103 in accordance with the operation O103 can include multiple processes. Referring to FIG. 14, a first sacrificial layer 401 is formed covering (or surrounding) a lower portion F12a of the fin structure F12. A height (or dimension) of the first sacrificial layer 401 defines a height (or dimension) of the lower S/D structures 103. Thus, the formation of the sacrificial layer is to define a position of the lower S/D structures 103 subsequently formed. In some embodiments, a deposition of a first dielectric material is performed to form a first dielectric layer covering and disposed between the isolation 301 and the fin segment F12. In some embodiments, a planarization is performed to remove the first dielectric layer above the patterned mask layer MK1, and an etch operation is performed to remove portions of the first dielectric layer above the lower portion F12a of the fin structure F12 to form the first sacrificial layer 401.

Figure 15:
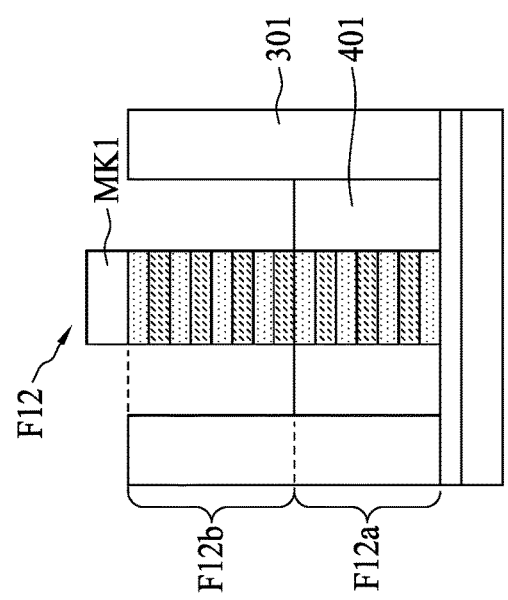

Referring to FIG. 15, a second sacrificial layer 402 is formed surrounding an upper portion F12b of the fin segment F12. The upper portion F12b is disposed on top of the lower portion F12a of the fin segment F12. In some embodiments as shown in FIG. 15, the second sacrificial layer 402 is conformal to a profile of a stack of the upper portion F12b and the patterned mask layer MK1. In some embodiments, the second sacrificial layer 402 covers only the upper portion F12a of the fin segment F12 and exposes the patterned mask layer MK1 depending on different processing. In some embodiments, a deposition of a second dielectric material is performed to form a second dielectric layer, and an etching operation is performed to remove portions of the second dielectric layer thereby forming the second sacrificial layer 402. The second dielectric material is different from the first dielectric material and has an etching selectivity different from that of the first dielectric material to an etchant.

Figure 16:
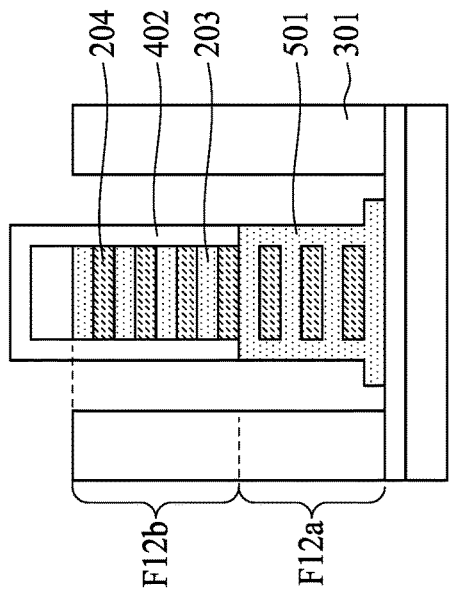

Referring to FIG. 16, the first sacrificial layer is removed by, for instance, a wet etching operation. The lower portion F12a of the fin segment F12 is exposed. In some embodiments, one of the semiconductive layers 203 and 204 is removed subsequently, thereby the remaining one of the semiconductive layers 203 and 204 becomes nanowires or channel regions of the first transistor 101 and the second transistor 102. In the following figures and specification, the first semiconductive layer 203 is illustrated as the nanowires or channel regions, but it is not intended to limit the present disclosure.

Figure 17:
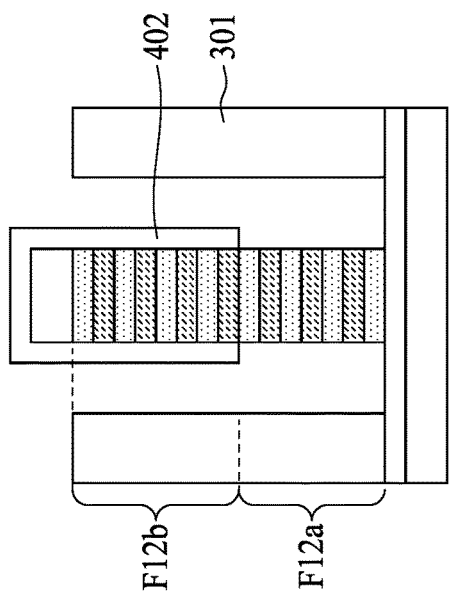

Referring to FIG. 17, a third semiconductive layer 501 is formed to provide better strength to the nanowires or the remaining semiconductive layers 203 after removal of the semiconductive layers 204. In some embodiments, the third semiconductive layer 501 having the same material as the first semiconductive layer 203 is formed around the lower portion F12a of the fin segment F12, and a clear interface between the first semiconductive layer 203 and the third semiconductive layer 501 might not be detected as shown in FIG. 17. In some embodiments, an epitaxial growth is performed to form the third semiconductive layer 501 only on the exposed semiconductive materials (the semiconductive layers 203 and 204) of the lower portion F12a of the fin segment F12.

Figure 18:
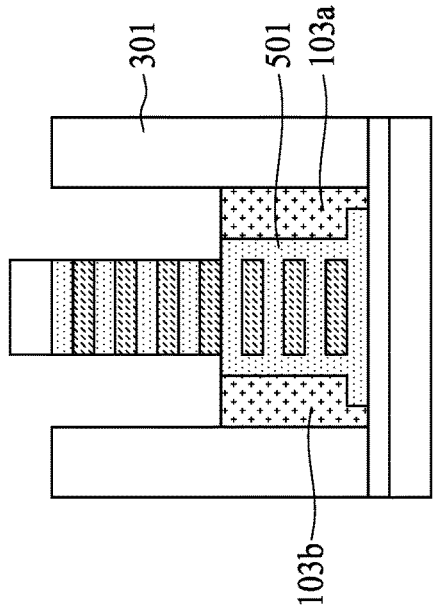

Referring to FIG. 18, in accordance with the operation O103, the first lower S/D structure 103a and the second lower S/D structure 103b are respectively formed between the isolations 301 and the third semiconductive layer 501. In some embodiments, a deposition and etching operation are sequentially performed to form the first lower S/D structure 103a and the second lower S/D structure 103b laterally adjacent to only the lower portion F12a of the fin segment F12. In some embodiments, an epitaxial growth is performed to form the first lower S/D structure 103a and the second lower S/D structure 103b adjacent to the exposed semiconductive material (i.e. the third semiconductive layer 501 in this embodiment).

Figure 19:
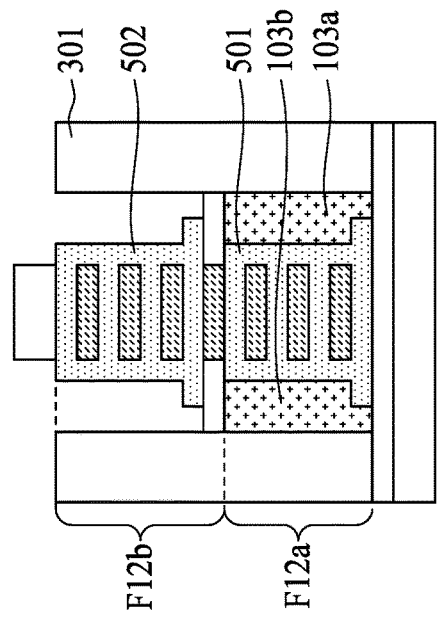
Figure 20:
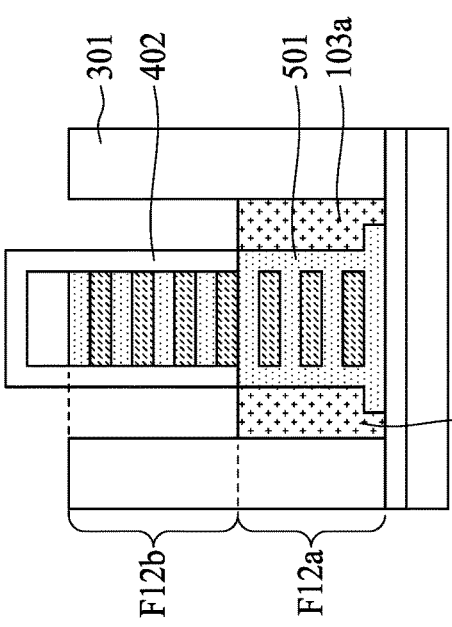
Figure 21:
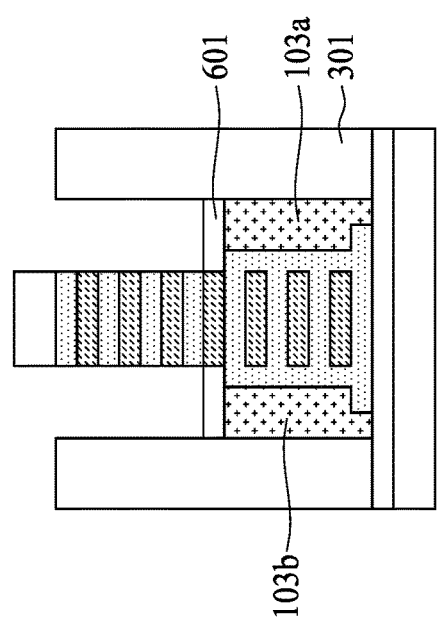

Referring to FIGS. 19 to 21, the second sacrificial layer 402 is removed, and the semiconductive layers 203 and 204 at the upper portion F12b of the fin segment F12 are exposed. In some embodiments, the second sacrificial layer 402 is removed by a wet etching operation, wherein the second sacrificial layer 402 has an etch selectivity different from that of the isolations 301 to a predetermined etchant. A dielectric layer 601 is formed between the isolations 301 and the fin segment F12, and disposed on top of the first lower S/D structure 103a and the second lower S/D structure 103b. The dielectric layer 601 covers or surrounds one or both of the semiconductive layers 203 and 204. As shown in FIG. 20, the dielectric layer 601 covers or surrounds only one semiconductive layer 204, but it is not intended to limit the present disclosure. In some embodiments, a deposition followed by an etching operation is performed to form the dielectric layer 601 as shown in FIG. 20. Similar to formation of the third semiconductive layer 501, a fourth semiconductive layer 502 is formed surrounding the upper portion F12b of the fin segment F12, as shown in FIG. 21. In some embodiments, a material of the fourth semiconductive layer 502 depends on the material of the channel region to be formed. In the embodiments, the fourth semiconductive layer 502 has the same material as the first semiconductive layer 203.

Figure 22:
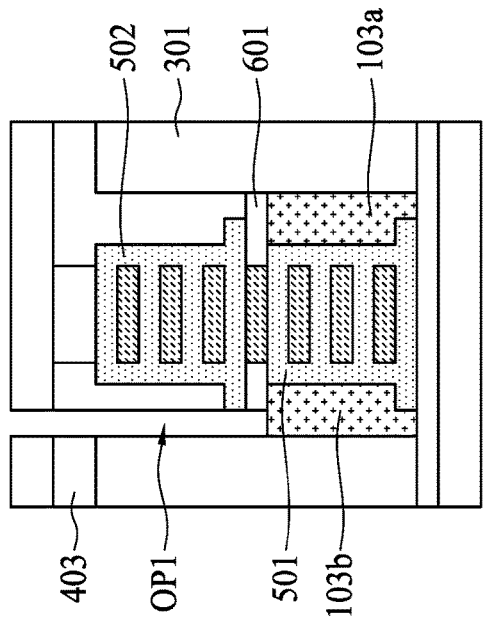
Figure 23:
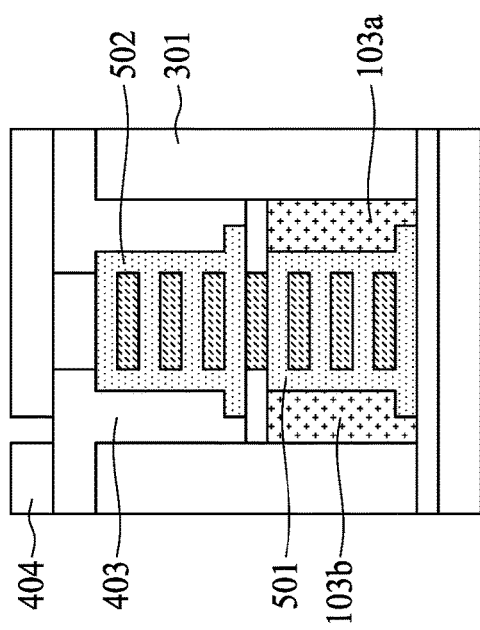
Figure 24:
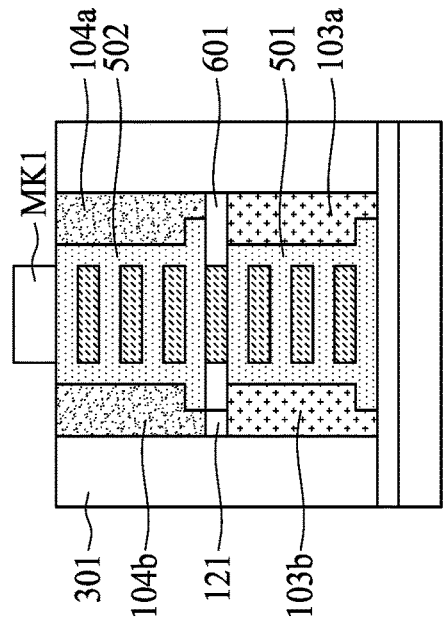

Referring to FIGS. 22 to 24, the via 121 is formed over the first lower S/D structure 103a and separated from the fin segment F12 by the dielectric layer 601. As shown in FIG. 22, a filling material 403 is formed to fill the space between the isolations 301 and the upper portion F12b of the fin segment F12. In some embodiments, the filling material 403 is a dielectric material, a material same as the dielectric layer 601 or any other suitable materials. In some embodiments, the filling material 403 also covers tops of the isolations 301 as shown in FIG. 22. In some embodiments, a deposition and a planarization are performed to form the filling material 403. A patterned layer 404 is formed on the filling material 403 and exposes a portion of the filling material 403 to define a position of the via 121. The exposed portion of the filling material 403 is removed, and a portion of the dielectric layer 601 exposed form the remaining portions of the filling material 403 is also removed to form an opening OP1. In some embodiments, the opening OP1 is formed by an anisotropic etching operation. A conducive material is filled in the opening OP1 between the dielectric layer 601 to form the via 121 as shown in FIG. 2. In some embodiments, a deposition and an etching operation are performed to form the via 121. The via 121 is in contact with the first lower S/D structure 103a. In some embodiment, the via 121 is separated from the third semiconductive layer 501 and the fourth semiconductive layer 502. In some embodiments, the via 121 is in contact with an edge of the third semiconductive layer 501 and/or an edge of the fourth semiconductive layer 502.

Figure 25:
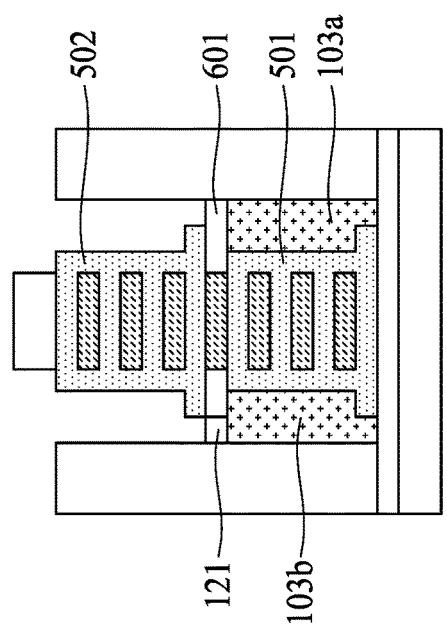
Figure 26:
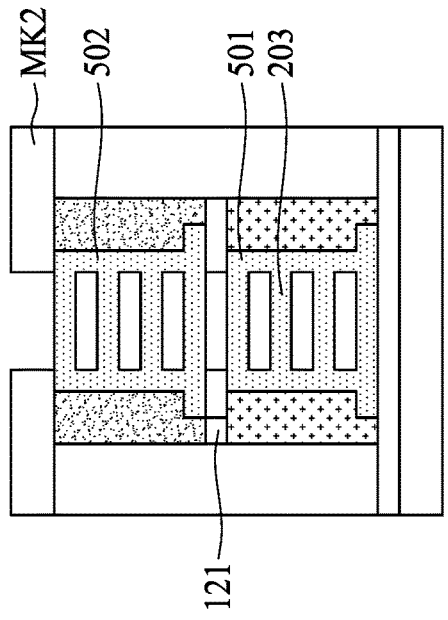

Referring to FIG. 25, in accordance with the operation O105, the first upper S/D structure 104a and the second upper S/D structure 104b are formed between the fin segment F12 and the isolations 301 and on the dielectric layer 601. The formation of the first upper S/D structure 104a and the second upper S/D structure 104b is similar to the formation of the first lower S/D structure 103a and the second lower S/D structure 103b. The second upper S/D structure 104b is electrically connected to the second lower S/D structure 103b by the via 121. In some embodiments, the via 121 is in contact with the second upper S/D structure 104b and the second lower S/D structure 103b.

Figure 27:
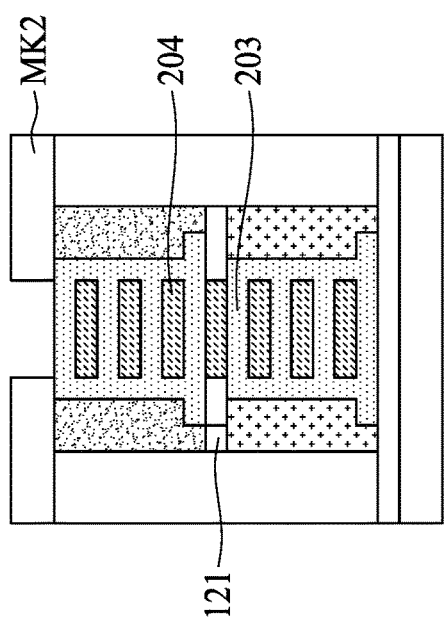
Figure 28:
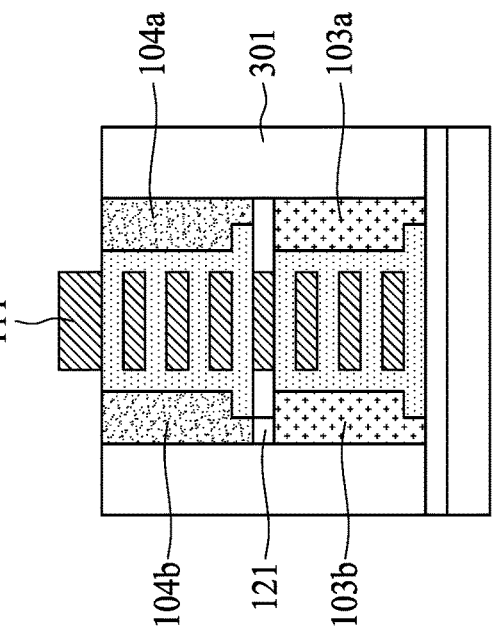
Figure 29:
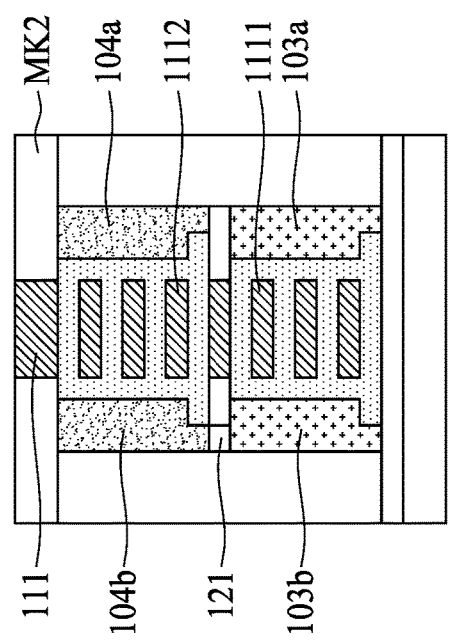

Referring to FIGS. 26 to 29, in accordance with the operation O106, the patterned mask layer MK1 is removed, and a patterned mask layer MK2 is formed on the isolations 301 and the upper S/D structures 104. The patterned mask layer MK2 exposes the fin segment F12 to expose the semiconductive layers 203 and 204. In some embodiments, the patterned mask layer MK2 covers the fourth conductive layer 502. Then the semiconductive layer 204 is removed as shown in FIG. 27. In some embodiments, a wet etching operation is performed to remove the semiconductive layers 204 without damage of the semiconductive layers 203 and the third semiconductive layer 501 and the fourth semiconductive layer 502. The gate structure 111 is formed around the semiconductive layers 203 of the fin segment F12 exposed from the patterned mask layer MK2. In some embodiments, the gate structure 111 includes one or more gate dielectric layers 1111 and a gate electrode 1112. In some embodiments, the one or more gate dielectric layers 1111 are formed around the semiconductive layers 203. In some embodiments, the gate dielectric layer 1111 is formed by atomic layer deposition. The gate electrode 1112 is then formed around the gate dielectric layer 1111. The patterned mask layer MK2 is then removed as shown in FIG. 29 to form the semiconductor structure 12 as shown in FIG. 7.

As above illustrated, the via 121 can be formed vertically between the upper S/D structure 104 and the lower S/D structure 103 in order to reduce a number of contact plugs 107. Thus, a dimension of a circuit layout can be reduced.

In the embodiments of the semiconductive structure 13, a density of the contact plugs 107 at a single side of the semiconductive structure 13 is further reduced by formation of a back side interconnect structure. FIGS. 30 to 40 show cross sections along a line B-B' in FIG. 7 to illustrate the formation of the back side interconnect structure.

Figure 30:
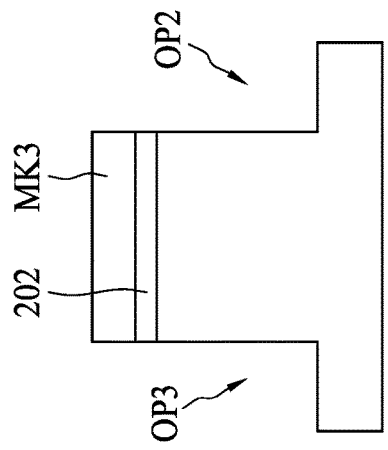
FIGS. 30-39 are cross sections at different stages of a method for forming a semiconductor structure according to some embodiments of the present disclosure.

Referring to FIG. 30, a cross section along the line B-B' in FIG. 7 after formation of the fin segment F12 shown in FIG. 13 is provided. A patterned mask layer MK3 is formed over the dielectric layer 202 to define positions of the conductive lines 1091 and 1092. Portions of the dielectric layer 202 are exposed from the patterned mask layer MK3 at where the conductive lines 1091 and 1092 subsequently formed.

Figure 31:
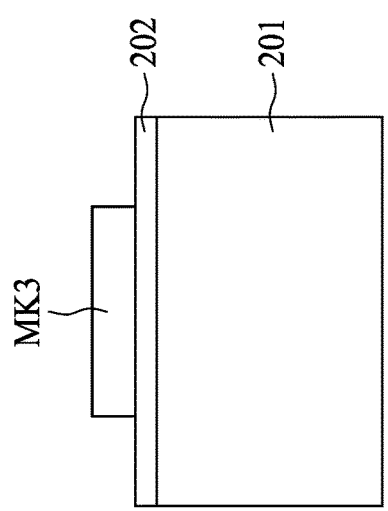
Figure 32:
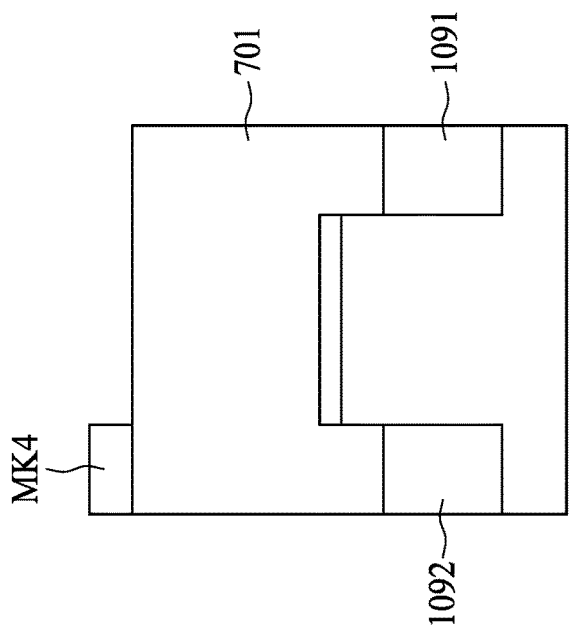

Referring to FIG. 31, portions of the dielectric layer 202 and portions of the semiconductive layer 201 exposed from the patterned mask layer MK3 are removed to form openings OP2 and OP3. In some embodiments, the openings OP2 and OP3 are formed by an etching operation. Referring to FIG. 32, the conductive lines 1091 and 1092 are formed at the removed portions of the semiconductive layer 201. In some embodiments, a deposition is performed to form a conductive layer filling the openings OP2 and OP3. In some embodiments, a planarization (e.g. a CMP operation) followed by an etching operation is performed to form the conductive lines 1091 and 1092. In some embodiments, the conductive lines 1091 and 1092 do not fill up the openings OP2 and OP3.

Figure 33:
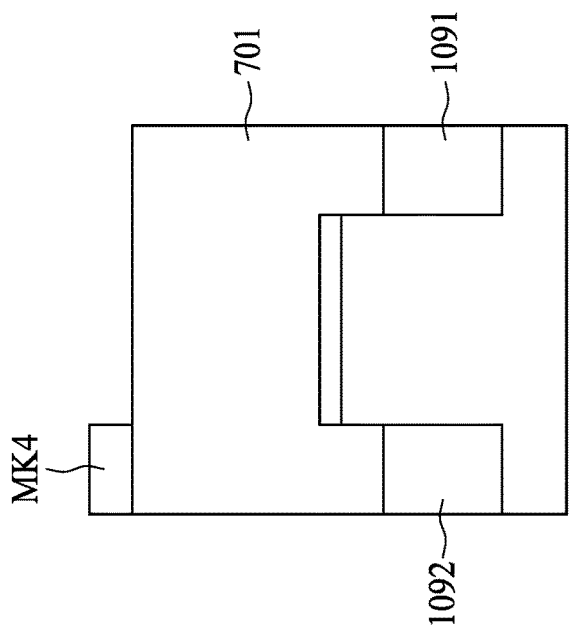
Figure 34:
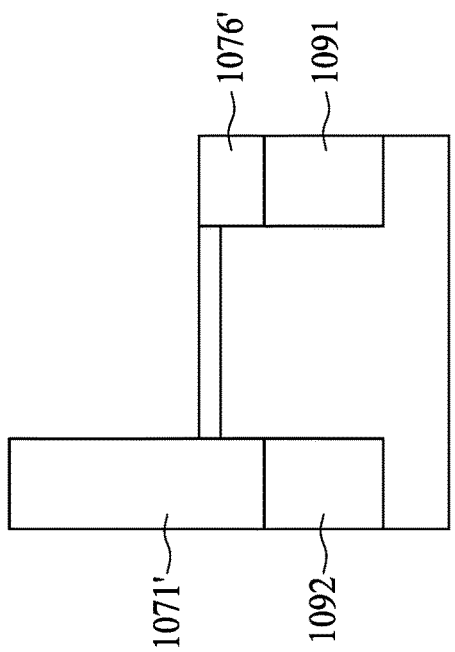

Referring to FIGS. 33 to 34, in order to form the contact plug 1076' and 1071', a conductive layer 701 is formed and patterned. As shown in FIG. 33, the conductive layer 701 is formed over the semiconductive layer 201 and the dielectric layer 202. In some embodiments, the conductive layer 701 fills up remaining portions of the openings OP2 and OP3. In some embodiments, the conductive layer 701 is in contact with the semiconductive layer 201 in the openings OP2 and OP3. A patterned mask layer MK4 is formed vertically over a portion of the conductive line 1092. Then an etching operation is performed to pattern the conductive layer 701 as shown in FIG. 34. As shown in FIG. 34, the portion of the conductive line 1092 covered by the patterned mask layer MK4 is remained to form the contact plug 1071'. In some embodiments, the etching operation stops when the dielectric layer 202 is exposed, and thus a portion of the conductive layer 701 directly over the conductive line 1092 is remained and forms the contact plug 1076'. The contact plug 1076' is electrically connected to (and in contact with) the conductive line 1091, and the contact plug 1071' is electrically connected to (and in contact with) the conductive line 1092.

Figure 35:
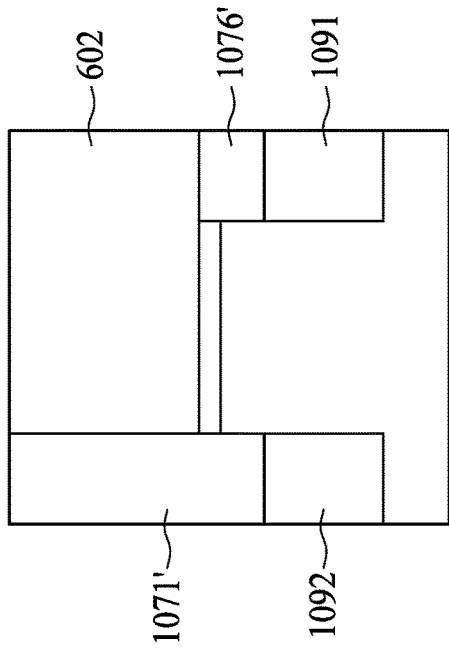
Figure 37:
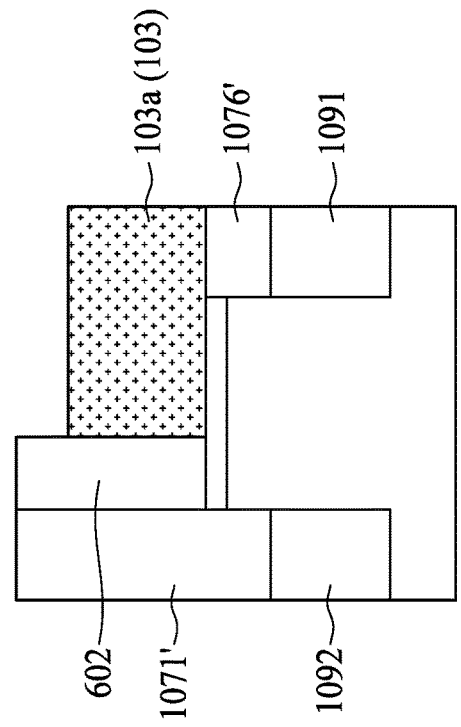
Figure 36:
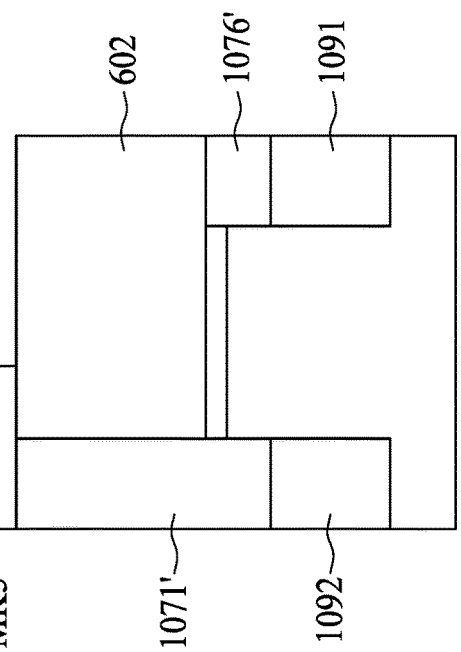

Referring to FIGS. 35 to 36, the first lower S/D structure 103a electrically isolated from the contact plug 1074' is formed. A dielectric layer 602 is formed over the dielectric layer 202 and the contact plug 1076', and laterally adjacent to the contact plug 1071' as shown in FIG. 35. In some embodiments, a deposition and a CMP are performed to form the dielectric layer 602. In some embodiments, the deposition and an etching operation are performed to form the dielectric layer 602. Then the dielectric layer 602 is patterned. As shown in FIG. 36, a patterned mask layer MK5 is formed covering the contact plug 1071' and a portion of the dielectric layer 602 directly adjacent to the contact plug 1071'. A portion of the dielectric layer 602 exposed from the patterned mask layer MK5 is removed. In some embodiments, the patterning of the dielectric layer 602 is performed by an etching operation. The patterning of the dielectric layer 602 is to isolate the first lower S/D structure 103a subsequently formed as shown in FIG. 37. The first lower S/D structure 103a is formed to electrically connect to the contact plug 1076'. The first lower S/D structure 103a is formed at the removed portion of the dielectric layer 602 and is separated from the contact plug 1071' by the remaining portion of the dielectric layer 602. In some embodiments, the first lower S/D structure 103a is in contact with the contact plug 1076'. In some embodiments, the first lower S/D structure 103a is formed by a deposition and an etching back operation. In some embodiments, a top surface of the first lower S/D structure 103a is lower than a top surface of the remaining portion of the dielectric layer 602 and a top surface of the contact plug 1071'.

Figure 38:
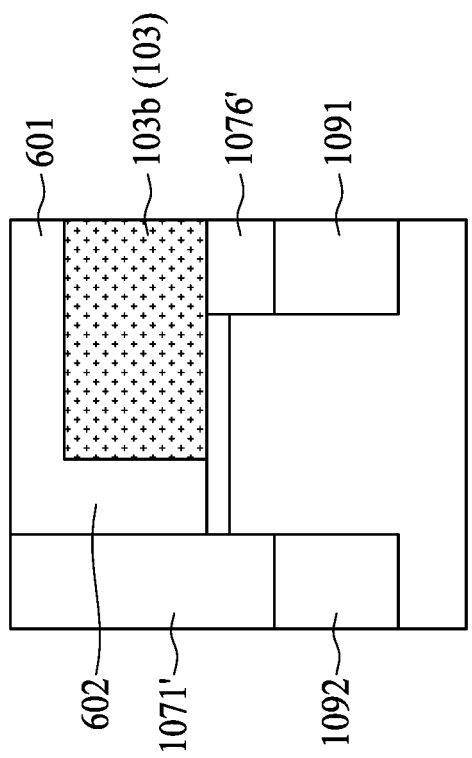

Referring to FIG. 38, the dielectric layer 601 is formed covering the first lower S/D structure 103a. In some embodiments, the dielectric layer 601 and the dielectric layer 602 includes a same dielectric material. In some embodiments, a deposition and a planarization are performed to form the dielectric layer 601. In some embodiments, a top surface of the dielectric layer 601 is substantially at a same level as the top surface of the remained portion of the dielectric layer 602 and the top surface of the contact plug 1071'.

Figure 39:
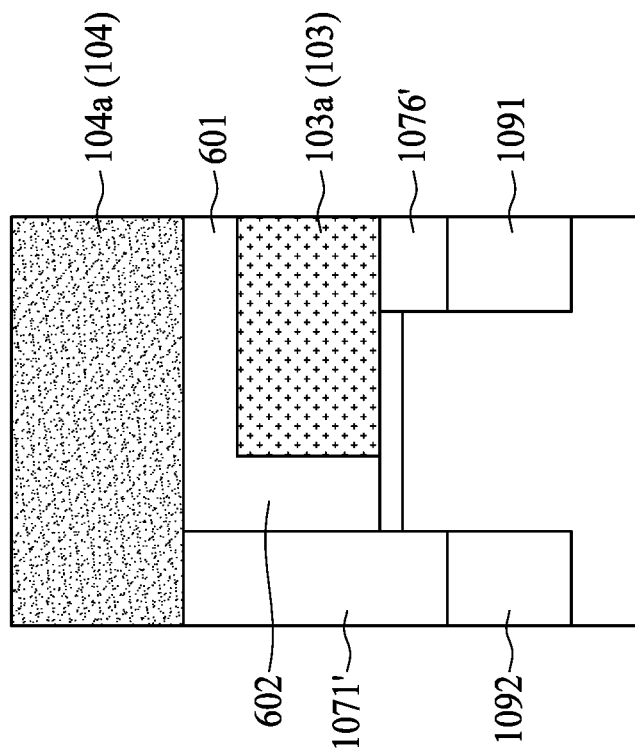

Referring to FIG. 39, the first upper S/D structure 104a electrically connect to the contact plug 1071' is formed. The first upper S/D structure 104a is separated from the first lower S/D structure 103a by the dielectric layer 601. In some embodiments, the first upper S/D structure 104a is in contact with the contact plug 1071'. Due to the contact plugs 1071' and 1076' connecting to the second layer M1' of the back side interconnect structure, there is no contact plugs 1071 and 1076 formed in the semiconductor structure 13 shown in FIG. 7, and a dimension of a circuit layout of the semiconductor structure 13 on a single side of the semiconductor structure 13 can be reduced.

In other embodiments, in order to form a semiconductor structure similar to the semiconductor structure 11, the method M10 the gate structure formed in the operation O106 may surround only the upper portion or the lower portion of the fin segment. In some embodiments, a lower portion or an upper portion of the gate structure 111 shown in FIG. 29 surrounding the lower portion F12a or the upper portion F12b of the fin segment F12 can be removed. After formation of the intermediate structure as shown in FIG. 29, a wet etching operation is performed to remove the lower portion or the upper portion of the gate structure 111. In some embodiments, a dielectric material is formed to replace the removed lower portion or the upper portion of the gate structure 111. However, the present disclosure is not limited herein. In other embodiments, the dielectric material can be formed after the formation of the intermediate structure as shown in FIG. 27 to cover only the upper portion F12b or the lower portion F12a of the fin segment F12. The formation of the gate structure 111 is then performed, and the gate structure 111 covers only the lower portion F12a or the upper portion F12b of the fin segment F12 exposed from the dielectric material.

Therefore, a semiconductor structure without a dummy gate structure is provided in order to reduce power consumption and improve a performance of the semiconductor structure. In some embodiments of the disclosure, the semiconductor structure may further exclude a dummy S/D structure to further reduce power consumption and simplify a circuit layout of the semiconductor structure. In addition to the absences of the dummy gate structure and/or the dummy S/D structure, the use of a via sandwiched between two vertically stacked S/D structures can further simplify the circuit layout. One contact plug is required to electrically connect the multiple S/D structures through the via, and a number of contact plugs for electrical connection to an interconnect structure can be reduced. The circuit layout of the semiconductor structure can be therefore simplified, and a dimension of the circuit layout can be reduced.

From an aspect, the present disclosure provides a semiconductor structure. The semiconductor structure includes a first transistor, a second transistor, a first dummy source/drain, a third transistor, a fourth transistor, and a second dummy source/drain. The first transistor and a second transistor, disposed adjacent to the first transistor, are at a first elevation. The first dummy source/drain is disposed at the first elevation. The third transistor and a fourth transistor, disposed adjacent to the third transistor, are at a second elevation different from the first elevation. The second dummy source/drain is disposed at the second elevation. The second transistor is vertically aligned with the third transistor. The first dummy source/drain is vertically aligned with a source/drain of the fourth transistor. The second dummy source/drain is vertically aligned with a source/drain of the first transistor. The gate structure between the second dummy source/drain and a source/drain of the third transistor is absent.

From another aspect, the present disclosure provides a semiconductor structure. The semiconductor structure includes a substrate, a first active layer over the substrate, a second active layer over the first active layer, a plurality of first source/drain structures, a plurality of second source/drain structures, a first gate structure, a second gate structure and a third gate structure. The plurality of first source/drain structures is disposed in the first active layer. The plurality of second source/drain structures is disposed in the second active layer and aligned with the plurality of first source/drain structures respectively. The first gate structure is disposed around the first active layer between the plurality of the first source/drain structures, and separated from the second active layer. The second gate structure extends from the first active layer to the second active layer, and is disposed between the plurality of first source/drain structures in the first active layer and between plurality of second source/drain structures in the second active layer. The third gate structure is disposed around the second active layer between the plurality of the second source/drain structures, and separated from the first active layer.

From another aspect, the present disclosure provides a method for manufacturing a semiconductor structure. The method includes several operations. A substrate is received. A portion of the substrate is removed to form a fin structure. Portions of the fin structures are removed to form a fin segment. A first source/drain structure is formed adjacent to a lower portion of the fin segment. The second source/drain structure is formed adjacent to an upper portion of the fin segment. A gate structure is formed surrounding the upper portion or the lower portion of the fin segment.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
    a first transistor and a second transistor disposed horizontally adjacent to the first transistor, the first transistor and the second transistor being at a first elevation;
    a first semiconductive component disposed at the first elevation adjacent to a source/drain of the second transistor;
    a third transistor and a fourth transistor disposed adjacent to the third transistor, the third transistor and the fourth transistor being at a second elevation different from the first elevation; and
    a second semiconductive component disposed at the second elevation adjacent to a source/drain of the third transistor,
    wherein the second transistor is vertically aligned with the third transistor, the first semiconductive component is vertically aligned with a source/drain of the fourth transistor, the second semiconductive component is vertically aligned with a source/drain of the first transistor, and a gate structure between the second semiconductive component and the source/drain of the third transistor is absent.

2. The semiconductor structure of claim 1, wherein a gate structure between the first semiconductive component and a source/drain of the second transistor is absent.

3. The semiconductor structure of claim 2, wherein the source/drain of the fourth transistor is electrically connected to the first semiconductive component through an inter-via, and the inter-via is sandwiched between the source/drain of the fourth transistor and the first semiconductive component.

4. The semiconductor structure of claim 1, wherein the source/drain of the first transistor is electrically connected to the second semiconductive component through an inter-via, and the inter-via is sandwiched between and vertically overlaps the source/drain of the first transistor and the second semiconductive component.

5. The semiconductor structure of claim 1, wherein the first transistor, the second transistor, the third transistor and the fourth transistor are fin field-effect transistors.

6. The semiconductor structure of claim 1, wherein the first transistor, the second transistor, the third transistor and the fourth transistor are gate-all-around field-effect transistors.

7. The semiconductor structure of claim 1, the first transistor, the second transistor, the third transistor and the fourth transistor together to form a transmission gate unit.

8. The semiconductor structure of claim 1, wherein a gate structure of the first transistor is electrically connected to a gate structure of the fourth transistor.

9. The semiconductor structure of claim 8, wherein the gate structure of the first transistor and the gate structure of the second transistor are electrically connected through an interconnect structure.

10. The semiconductor structure of claim 1, wherein a gate structure of the second transistor is electrically connected to a gate structure of the third transistor.

11. The semiconductor structure of claim 10, wherein the gate structure of the second transistor and the gate structure of the third transistor are a monolithic structure.

12. The semiconductor structure of claim 1, wherein the second semiconductive component is electrically connected to the third transistor through a metal line disposed at a third elevation different from the first elevation and the second elevation.

13. A semiconductor structure, comprising:
a first transistor, disposed at a first elevation;
a second transistor, disposed at the first elevation and adjacent to the first transistor;
a third transistor, disposed at a second elevation higher than the first elevation and vertically aligned with the second transistor;
a fourth transistor, disposed at the second elevation and adjacent to the third transistor;
a first semiconductive component, disposed at the first elevation and vertically aligned with the source region or the drain region of the fourth transistor; and
a second semiconductive component, disposed at the second elevation and vertically aligned with the source region or the drain component of the first transistor, wherein the second transistor and the third transistor have a common gate structure, the gate structure of the first transistor is at the first elevation, and a height of the gate structure of the first transistor is less than a height of the common gate structure.

14. The semiconductor structure of claim 13, wherein the gate structure of the first transistor extends in and stop at the first elevation.

15. The semiconductor structure of claim 13, wherein a height of the gate structure of the fourth transistor is less than the height of the common gate structure.

16. The semiconductor structure of claim 13, wherein the gate structure of the fourth transistor extends in and stop at the second elevation.

17. The semiconductor structure of claim 13, wherein the gate structure of the fourth transistor and the gate structure of the first transistor are at different elevation.

18. The semiconductor structure of claim 13, wherein a horizontal projection of the gate structure of the fourth transistor is separated from a horizontal projection of the gate structure of the first transistor.

19. The semiconductor structure of claim 13, wherein the gate structure of the first transistor is electrically connected to the gate structure of the fourth transistor, and the gate structure of the second transistor is the gate structure of the third transistor.

20. A method for manufacturing a semiconductor structure, comprising:
forming a fin structure over a substrate;
forming a source/drain of a first transistor, a source/drain of a second transistor and a first semiconductive component in the fin structure of the substrate at a first elevation, wherein the first semiconductive component is adjacent to the source/drain of the second transistor;
forming a source/drain of a third transistor, a source/drain of a fourth transistor, and a second semiconductive component in the fin structure of the substrate at a second elevation, wherein the second semiconductive component is adjacent to the source/drain of the third transistor, and the second elevation is different from the first elevation;
forming a plurality of gate structures, including a first gate structure surrounding the fin structure at the first elevation, a second gate structure extending surrounding the fin structure at the first elevation and the second elevation, and a third gate structure surrounding the fin structure at the second elevation,
wherein the first gate structure is of the first transistor, a lower portion of the second gate structure is of the second transistor, an upper portion of the second gate structure is of the third transistor, and the third gate structure is of the fourth transistor, and a length of the second gate structure is greater than a length of the first gate structure or the third gate structure along a vertical direction.

* * * * *